(12) United States Patent
Tsukada et al.

(10) Patent No.: US 7,612,429 B2
(45) Date of Patent: *Nov. 3, 2009

(54) CHIP RESISTOR, PROCESS FOR PRODUCING THE SAME, AND FRAME FOR USE THEREIN

(75) Inventors: Torayuki Tsukada, Kyoto (JP); Tadatoshi Miwa, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/533,489

(22) PCT Filed: Oct. 30, 2003

(86) PCT No.: PCT/JP03/13964

§ 371 (c)(1),
(2), (4) Date: Apr. 28, 2005

(87) PCT Pub. No.: WO2004/040592

PCT Pub. Date: May 13, 2004

(65) Prior Publication Data

US 2006/0097340 A1     May 11, 2006

(30) Foreign Application Priority Data

Oct. 31, 2002  (JP)  ............. 2002-318648
Nov. 29, 2002  (JP)  ............. 2002-348883
Nov. 29, 2002  (JP)  ............. 2002-348884
Dec. 5, 2002   (JP)  ............. 2002-353514

(51) Int. Cl.
    H01L 29/93       (2006.01)
(52) U.S. Cl. ............... 257/536; 257/E21.518; 438/123; 338/309; 338/332
(58) Field of Classification Search ............... 257/536, 257/E21.518, 532; 438/123; 338/309, 332
See application file for complete search history.

(56) References Cited

U.S. PATENT DOCUMENTS

| | | | | |
|---|---|---|---|---|
| 4,706,060 A | * | 11/1987 | May | ............... 338/20 |
| 5,170,146 A | * | 12/1992 | Gardner et al. | ............... 338/313 |
| 5,339,068 A | * | 8/1994 | Tsunoda et al. | ............... 338/332 |
| 5,450,055 A | * | 9/1995 | Doi | ............... 338/332 |
| 6,777,778 B2 | * | 8/2004 | Sato | ............... 257/536 |
| 6,955,942 B2 | * | 10/2005 | Kobayashi et al. | ............... 438/106 |

FOREIGN PATENT DOCUMENTS

| | | |
|---|---|---|
| EP | 0326212 A1 * | 1/1989 |
| JP | 47-27876 | 8/1972 |
| JP | 50-128657 | 10/1975 |
| JP | 7-29704 | 1/1995 |
| JP | 10-135013 | 5/1998 |
| JP | 2002-57009 | 2/2002 |
| JP | 2002-208502 | 7/2002 |

* cited by examiner

Primary Examiner—Wael Fahmy
Assistant Examiner—John C Ingham
(74) Attorney, Agent, or Firm—Hamre, Schumann, Mueller & Larson, P.C.

(57) ABSTRACT

A chip resistor (A1) comprises a first insulation layer (2A) covering the regions between a plurality of electrodes (3) on a rear surface (10a) of a resistor (1), and a second insulation layer covering a pair of side faces of the resistor (1). Inadvertent adhesion of solder to an improper part of the resistor (1) can thereby be eliminated. A solder layer (4) is preferably formed on a pair of end faces (10d) of the resistor (1). In so doing, a solder fillet can be formed appropriately.

16 Claims, 33 Drawing Sheets

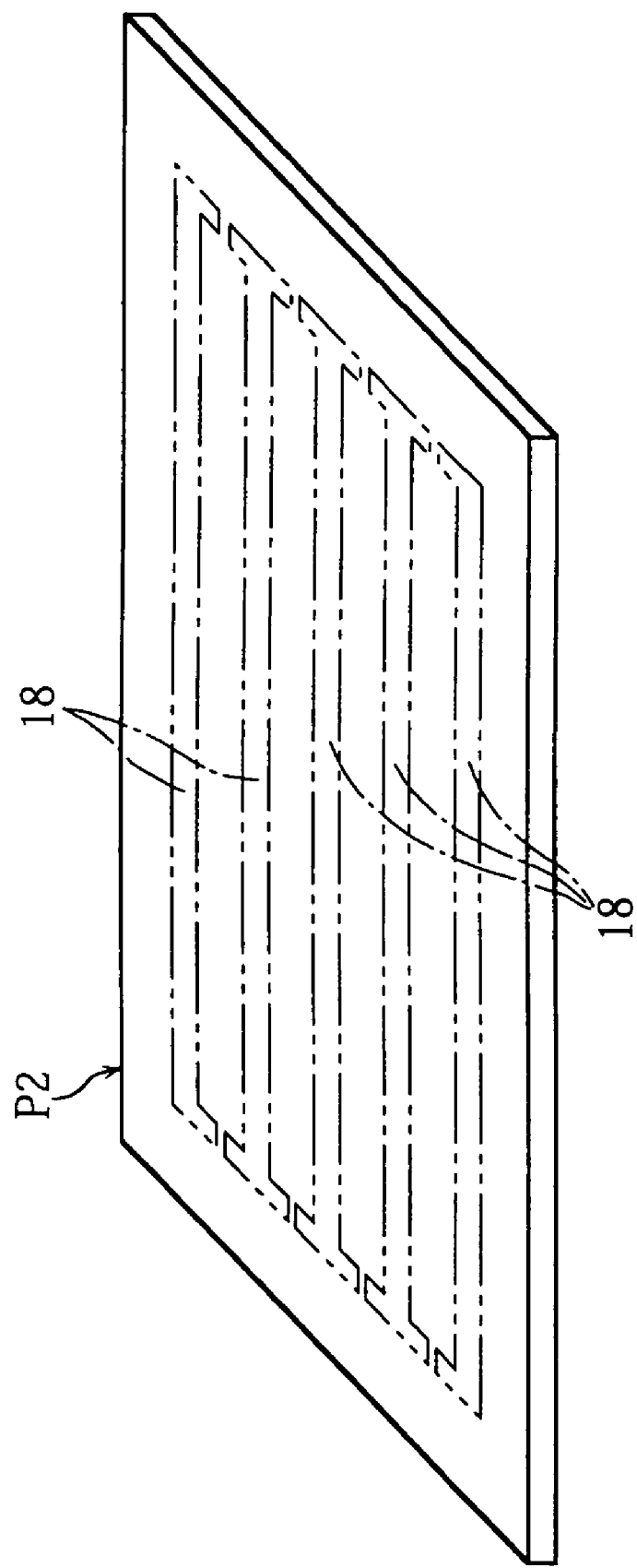

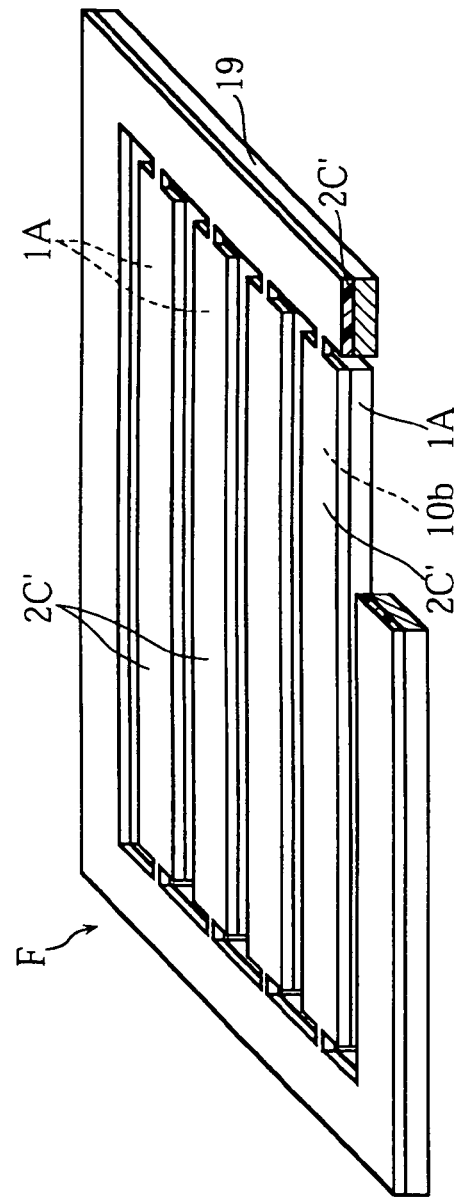
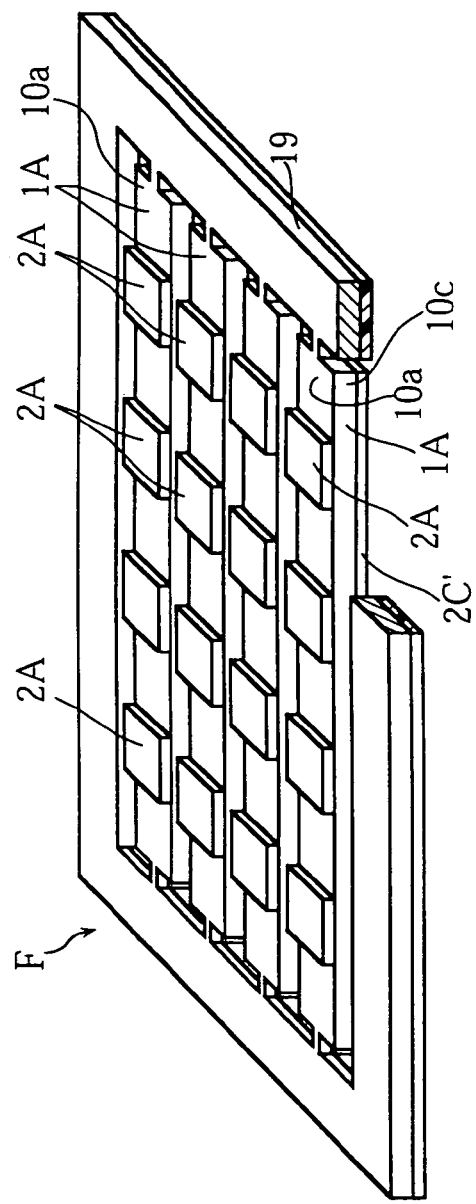

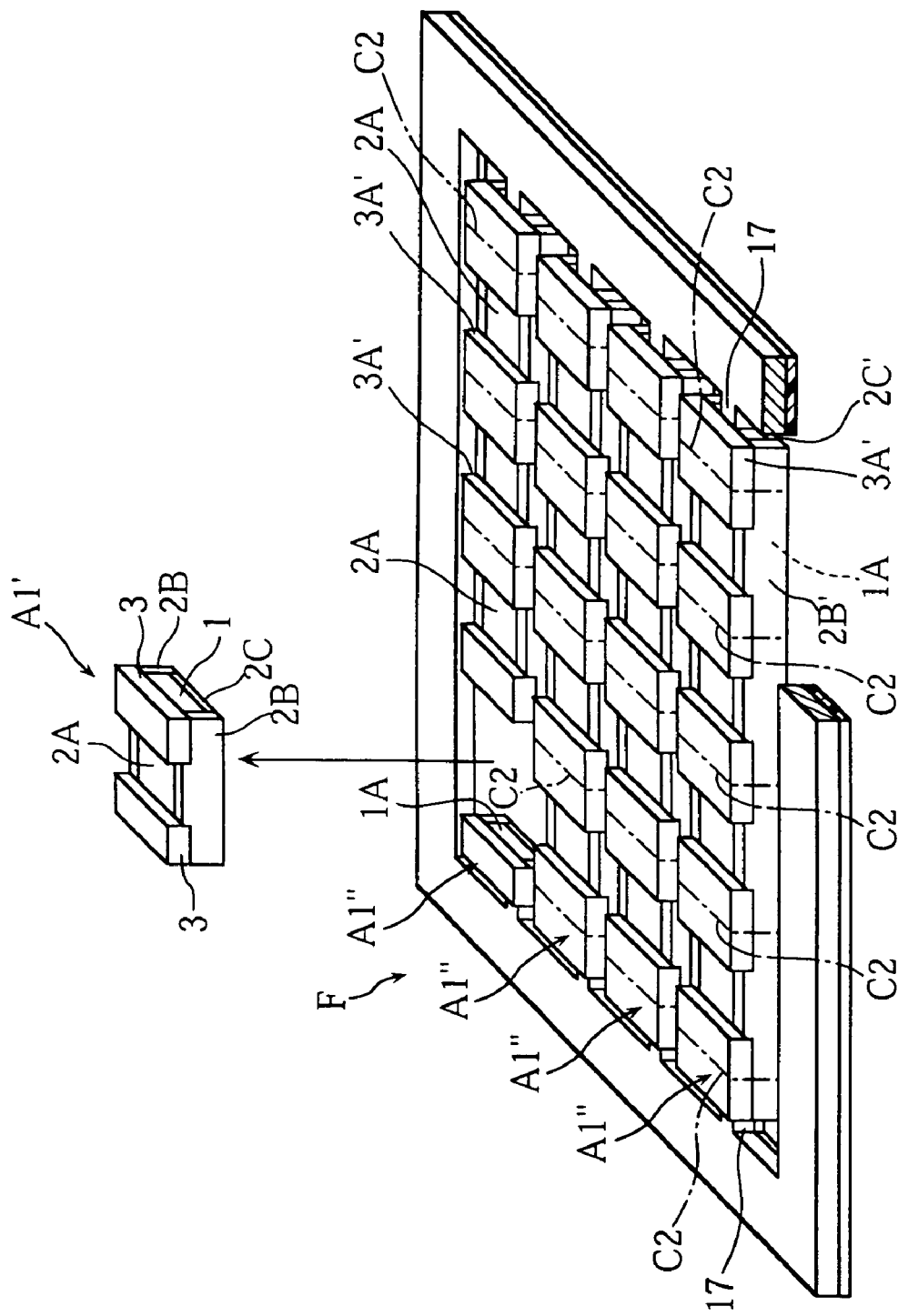

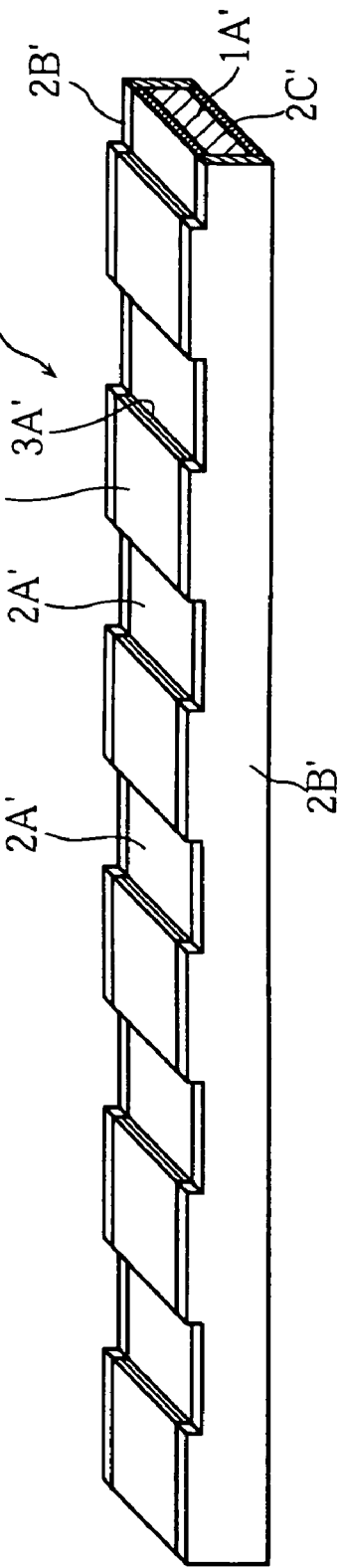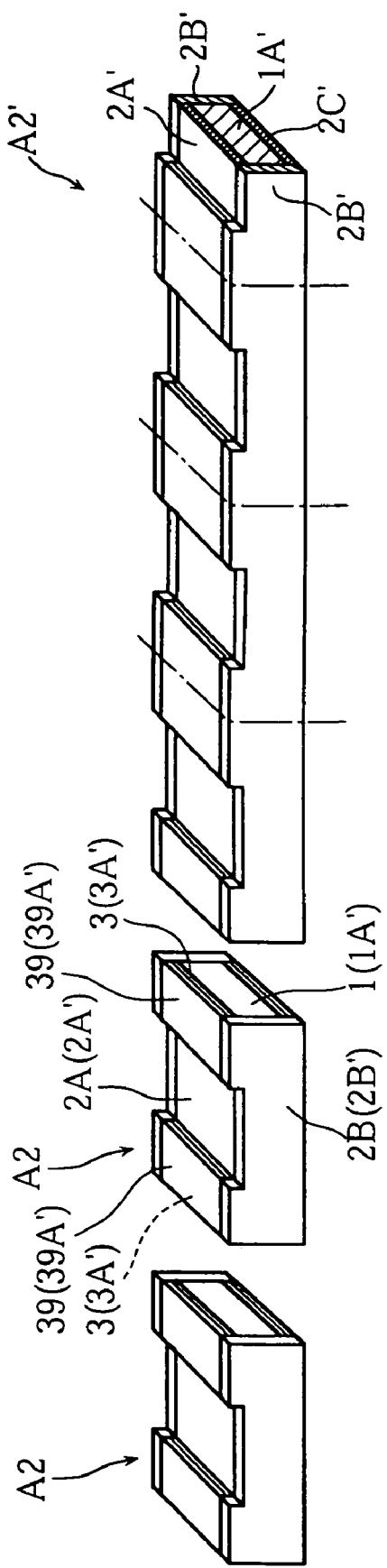

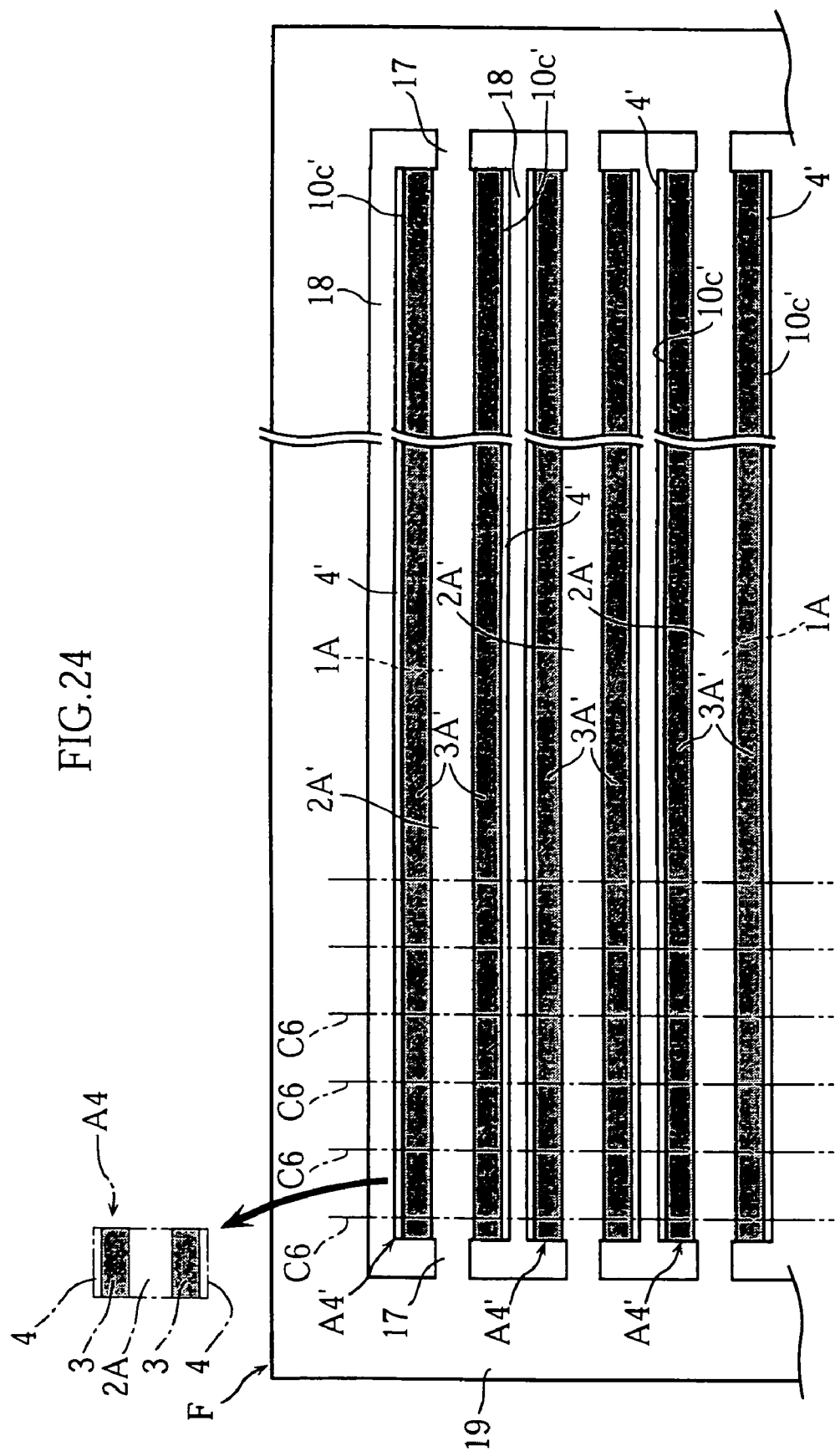

FIG. 37
PRIOR ART
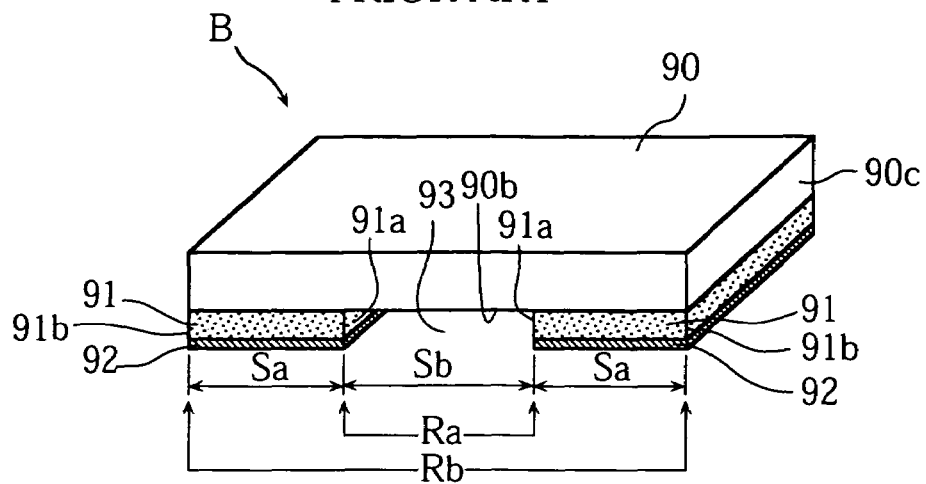
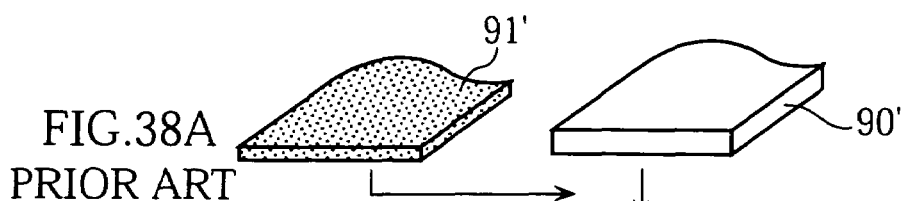
FIG. 38A
PRIOR ART
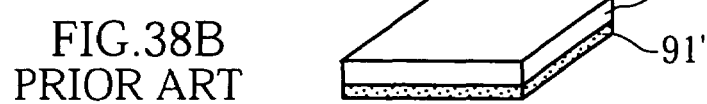
FIG. 38B
PRIOR ART
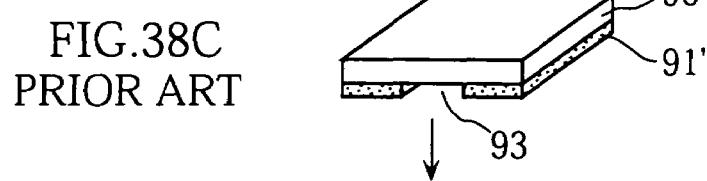
FIG. 38C
PRIOR ART
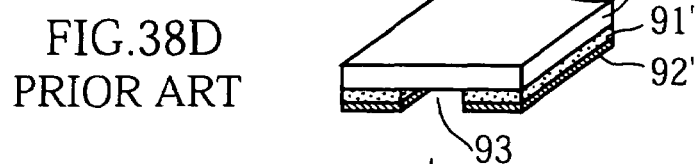
FIG. 38D
PRIOR ART
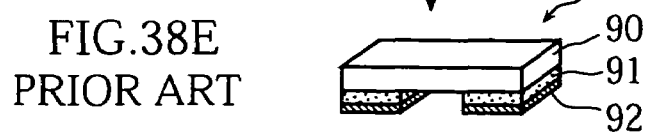
FIG. 38E
PRIOR ART

US 7,612,429 B2

CHIP RESISTOR, PROCESS FOR PRODUCING THE SAME, AND FRAME FOR USE THEREIN

TECHNICAL FIELD

The present invention relates to a chip resistor, a manufacturing method thereof, and a frame used in this manufacturing method.

BACKGROUND ART

FIG. 37 shows an example of a conventional chip resistor (see Japanese Unexamined Patent Application Publication 2002-57009, for example). A chip resistor B shown in the drawing is constituted such that a pair of electrodes 91 is provided on a lower surface 90b of a metallic chip-form resistor 90. The electrodes 91 are separated from each other by a void portion 93. A solder layer 92 is formed on the lower surface of each electrode 91 as means for improving solder ability during mounting.

This chip resistor B is manufactured using a method such as that shown in FIGS. 38A to 38E. First, as shown in FIG. 38A, two metallic plates 90', 91' are prepared as the materials for the resistor 90 and electrodes 91, and then, as shown in FIG. 38B, the metallic plate 91' is superposed on the lower surface of the metallic plate 90' and joined thereto. Next, as shown in FIG. 38C, a part of the metallic plate 91' is cutaway by machining to form the void portion 93. Next, as shown in FIG. 38D, a solder layer 92' is formed on the lower surface of the metallic plate 91', and then the metallic plates 90', 91' are cut as shown in FIG. 38E. Thus the chip resistor B is manufactured.

However, this prior art has the following problems.

Firstly, the region between the pair of electrodes 91 on the lower surface 90b of the resistor 90 and each side face 90c of the resistor 90 are not protected by insulation. As a result, when the chip resistor B is surface-mounted in a desired location using solder, a part of the solder may seep out from below the electrodes 91 and become adhered to the lower surface 90b of the resistor 90 or the side faces 90c. When such a situation arises, a large error occurs in the resistance value, leading to aberrations in the specifications of electric circuits produced using the chip resistor B. As the resistance value of the chip resistor B decreases such that the need to reduce the error in the resistance value increases, this problem becomes more serious.

Secondly, the series of manufacturing operations in the manufacturing method of this prior art is complicated, and hence the productivity of the chip resistor is poor. More specifically, in the prior art, the void portion 93 is formed by machining. Further, during this machining process, a dimension Sb between the pair of electrodes 91 must be set precisely. Accordingly, this machining process must be performed meticulously, leading to a deterioration in the productivity of the chip resistor B. Also in this prior art, the chip resistor B is manufactured through a cutting process, and errors may occur in the resistance values of the electrodes depending on the precision of this cutting process.

Thirdly, when the chip resistor is incorporated into a desired circuit, an inspection is performed to determine whether or not the chip resistor has been mounted appropriately. In this case, the determination as to whether or not the chip resistor has been soldered appropriately is preferably performed by means of exterior observation. For this purpose, it is desirable that a part of the solder used in the mounting operation be formed as a solder fillet adhered to the end face of the resistor in the chip resistor. In so doing, it is possible to determine with a high degree of likelihood that the chip resistor has been mounted appropriately by confirming the existence of the solder fillet, and conversely, that the chip resistor has been mounted inappropriately when the solder fillet cannot be confirmed. In the prior art, however, although the solder layer 92 is formed on the lower surface of each electrode 91, it is sometimes difficult to form a solder fillet merely by providing the solder layer 92. When the chip resistor B is surface mounted in a desired location using a solder reflow method, the parts of the electrodes 91 to be joined are coated in advance with cream solder, but if the coating amount is insufficient, an appropriate solder fillet is not formed. Hence in the prior art, it is difficult to determine whether or not the chip resistor B has been surface mounted appropriately according to the presence of a solder fillet, which is inconvenient. Furthermore, since a solder fillet is not formed in the prior art, the joining strength of the solder may not be sufficient.

Fourthly, the chip resistor B is constituted such that a width Sa of each electrode 91 in the arrangement direction of the electrode pair 91 is comparatively large. Hence, when a measurement probe is brought into contact with the electrode pair 91 to measure the resistance values thereof, a large difference occurs between a resistance value Ra when the measurement probe contacts an inside edge portion 91a of the respective electrodes 91, and a resistance value Rb when the measurement probe contacts an outside edge portion 91b. This large difference in the resistance value according to the part of the electrodes 91 contacted by the measurement probe is undesirable since it leads to a wide variation in the resistance value of the chip resistor B depending on the manner in which the chip resistor B is used. More specifically, when the chip resistor B is surface mounted in a desired location using solder, for example, the solder may deviate toward the inside edge portion 91a of the electrodes 91, for example, rather than adhering tightly to the entire lower surface of the electrodes 91. Conversely, the solder may deviate toward the outside edge portion 91b of the lower surface of the electrodes 91. In the prior art, wide variation in the resistance value occurs in such cases. When the chip resistor B has a low resistance of 10 mΩ or less, for example, the difference between the aforementioned resistance value Ra and resistance value Rb is small, but compared to the overall resistance value of the chip resistor B, this difference is proportionally extremely large. Therefore, this problem becomes more serious as the resistance of the chip resistor B decreases.

As means of suppressing the fourth problem described above, the thickness of the electrodes 91 may be increased so that the electrical resistance of the electrodes 91 themselves is reduced, for example. However, when such means are employed, the overall thickness of the chip resistor B increases, the amount of the metallic plate 91' that must be cut to form the void portion 93 increases, and as a result, the manufacturing cost of the chip resistor B rises.

DISCLOSURE OF THE INVENTION

An object of the present invention is to provide a chip resistor and a manufacturing method thereof which can solve or suppress the problems described above. Another object of the present invention is to provide a frame which is suitable for use in the manufacture of such a chip resistor.

A chip resistor provided by a first aspect of the present invention comprises a chip-form resistor having a front surface and a rear surface provided at an interval in the thickness direction and a pair of side faces extending in a fixed direction at an interval in the width direction, and a plurality of electrodes provided in series on the rear surface of the resistor at intervals in this fixed direction. The chip resistor also comprises a first insulation layer covering the regions between the plurality of electrodes on the rear surface of the resistor, and a second insulation layer covering the pair of side faces of the resistor.

The chip resistor according to the present invention preferably further comprises a third insulation layer covering the front surface of the resistor.

Preferably, at least two of the first through third insulation layers are formed from an identical material.

Preferably, the thickness of each electrode is greater than the thickness of the first insulation layer.

Two or more electrodes are preferably provided as the plurality of electrodes.

The resistor preferably comprises a pair of end faces provided at an interval in the fixed direction, and a solder layer is preferably formed on each end face.

Preferably, the plurality of electrodes is provided at a remove from the edges of the rear surface of the resistor in the aforementioned fixed direction.

A manufacturing method for a chip resistor provided by a second aspect of the present invention comprises the steps of: producing a bar-form resistor aggregate in which a plurality of electrodes is provided on a rear surface of a bar-form resistor material, the plurality of electrodes being arranged at intervals in the length direction of the resistor material, and the regions between the plurality of electrodes on the rear surface and a pair of side faces of the resistor material are covered with first and second insulation layers; and dividing the resistor aggregate into a plurality of chip resistors by cutting the resistor aggregate in a plurality of locations in the length direction thereof.

The step of producing the bar-form resistor aggregate preferably comprises the steps of: providing a pattern-formed insulation layer and a conductive layer serving as the electrodes on one surface of a plate serving as a resistor material, and then dividing the plate into the bar-form resistor material; and forming an insulation layer on the pair of side faces of the bar-form resistor material.

The step of producing the bar-form resistor aggregate preferably comprises the steps of: pattern-forming an insulation layer on one surface of a plate serving as a resistor material, and then dividing the plate into the bar-form resistor material; and forming an insulation layer on the pair of side faces of the bar-form resistor material, and forming the plurality of electrodes on the surface on which the pattern-formed insulation layer is formed.

Preferably, the manufacturing method for a chip resistor according to the present invention further comprises a step of forming a third insulation layer covering the front surface of the resistor material prior to dividing the resistor aggregate into the plurality of chip resistors.

A manufacturing method for a chip resistor provided by a third aspect of the present invention comprises the steps of: producing a bar-form resistor aggregate provided with a plurality of electrodes on the rear surface of a bar-form resistor material, the plurality of electrodes being arranged at intervals in the length direction of the resistor material, and a first insulation layer covering the regions between the plurality of electrodes; dividing the resistor aggregate into a plurality of chip resistors having protruding resistor side faces by cutting the resistor aggregate in a plurality of locations in the length direction thereof; and forming a second insulation layer on the side faces of each resistor of the plurality of chip resistors.

A manufacturing method for a chip resistor provided by a fourth aspect of the present invention comprises the steps of: preparing a frame constituted by a conductive member comprising a plurality of plate-form portions extending in a fixed direction, each plate-form portion having a front surface, a rear surface, and a pair of side faces, and a support portion for supporting the plurality of plate-form portions; producing a plurality of bar-form resistor aggregates by forming, on either of the front surface and rear surface of each plate-form portion, a plurality of electrodes arranged at intervals in the fixed direction and a first insulation layer positioned in the regions between the plurality of electrodes, and by forming a second insulation layer on the pair of side faces of each plate-form portion; and dividing each resistor aggregate into a plurality of chip resistors such that each plate-form portion forms a plurality of chip-form resistors.

The step of forming a second insulation layer on the pair of side faces of each plate-form portion is preferably performed after rotating the plate-form portions about an axis extending in the length direction thereof by twisting a connecting portion between each plate-form portion and the support portion of the frame such that the connecting portion deforms.

Preferably, a frame in which the connecting portion is formed narrower than the plate-form portion is used as the aforementioned frame.

Preferably, a step of forming a third insulation layer on one of the front surface and rear surface of each plate-form portion opposite to the surface on which the first insulation layer is formed, before dividing the resistor aggregates into the plurality of chip resistors, is further comprised.

The step of producing the bar-form resistor aggregate preferably comprises a step of forming the plurality of electrodes by plating processing after forming the first through third insulation layers on the plate-form portions.

A frame provided by a fifth aspect of the present invention is constituted by a conductive member comprising a plurality of plate-form portions extending in a fixed direction, each plate-form portion having a front surface, a rear surface, and a pair of side faces, and a support portion for supporting the plurality of plate-form portions. In the frame, a connecting portion between each plate-form portion and the support portion is formed narrower than the plate-form portion.

Preferably, the support portion has a frame shape, and each of the two end portions in the length direction of each plate-form portion is supported on the support portion via the connecting portion.

A chip resistor provided by a sixth aspect of the present invention comprises a chip-form resistor having a front surface and a rear surface provided at an interval in the thickness direction and a pair of end faces provided at an interval in a fixed direction intersecting the thickness direction, and a plurality of electrodes provided on the rear surface of the resistor at intervals in the fixed direction. In the chip resistor, a solder layer is formed on each end face of the resistor.

The solder layer preferably covers the entirety of each end face.

A first insulation layer covering the regions between the plurality of electrodes on the rear surface of the resistor is preferably further comprised.

A solder layer formed integrally with or separately to the aforementioned solder layer is preferably laminated onto each of the electrodes.

A manufacturing method for a chip resistor provided by a seventh aspect of the present invention comprises the steps of: producing a bar-form resistor aggregate in which a plurality of electrode-forming conductive layers is provided on one of a front surface and a rear surface of a bar-form resistor material, the plurality of electrode-forming conductive layers being arranged at intervals in the width direction of the resistor material, and a solder layer is formed on a pair of side faces extending in the length direction of the resistor material; and dividing the resistor aggregate into a plurality of chip resistors by cutting the resistor aggregate in a plurality of locations in the length direction thereof.

A manufacturing method for a chip resistor provided by an eighth aspect of the present invention comprises the steps of: producing a chip resistor as yet unformed with a solder layer, in which a plurality of electrodes is formed at intervals in a fixed direction on one of a front surface and a rear surface of a chip-form resistor, and an insulation layer covering the resistor is provided such that a pair of end faces of the resistor in the fixed direction is partially exposed; and forming a solder layer on the pair of end faces of the resistor.

A plurality of the chip resistors as yet unformed with a solder layer is preferably produced, and in the solder layer forming step, the solder layer is preferably formed at once on the plurality of chip resistors as yet unformed with a solder layer by barrel plating processing.

The step of producing the chip resistor as yet unformed with a solder layer preferably comprises the steps of: producing a bar-form resistor aggregate in which a plurality of electrode-forming conductive layers is provided on one surface of a front surface and a rear surface of a bar-form resistor material, the plurality of electrode-forming conductive layers being arranged at intervals in the length direction of the resistor material, and an insulation layer is formed on a pair of side faces extending in the length direction of the resistor material and a surface opposite the aforementioned one surface; and cutting the resistor aggregate in a plurality of locations in the length direction thereof.

The step of producing the bar-form resistor aggregate preferably comprises the steps of: providing a conductive layer serving as the electrodes on one surface of a plate serving as the resistor material; and dividing the plate into the bar-form resistor material.

The step of producing the bar-form resistor aggregate preferably comprises the steps of: preparing a frame constituted by a conductive member comprising a plurality of plate-form portions; and providing a conductive layer serving as the electrodes on one surface of each of the plate-form portions serving as the bar-form resistor material.

A chip resistor provided by a ninth aspect of the present invention comprises a chip-form resistor having a front surface and a rear surface provided at an interval in the thickness direction and a pair of end faces provided at an interval in a fixed direction intersecting the thickness direction, and a plurality of electrodes provided on the rear surface of the resistor at intervals in the fixed direction. In the chip resistor, the plurality of electrodes is provided at a remove from the edges of the rear surface of the resistor in the fixed direction.

The chip resistor according to the present invention preferably comprises an insulation layer covering the regions between the plurality of electrodes on the rear surface of the resistor.

The insulation layer preferably covers the regions between the plurality of electrodes and the edges on the rear surface of the resistor.

A manufacturing method for a chip resistor provided by a tenth aspect of the present invention comprises the steps of: pattern-forming an insulation layer on one surface of a plate serving as a resistor material; forming a conductive layer in a region of this one surface of the plate in which the insulation layer is not formed; and dividing the plate into a plurality of chip-form resistors. With the manufacturing method, division of the plate is performed in a state in which a part of the conductive layer on the aforementioned one surface of each resistor is formed as a pair of electrodes removed from each other and sandwiching a part of the insulation layer, and the pair of electrodes is removed from the edges of the resistor in the arrangement direction of the electrodes.

Other features and advantages of the present invention will become more apparent from the following description of embodiments of the present invention.

BRIEF DESCRIPTION OF THE DRAWINGS

FIG. 9 is a perspective view showing a method of manufacturing the frame shown in FIG. 8A;

FIGS. 10A and 10B are partially cut-away perspective views showing a part of the processes for manufacturing the chip resistor using the frame;

FIG. 13 is a partially cut-away perspective view showing a part of the processes for manufacturing the chip resistor using the frame;

FIGS. 17C and 17D are perspective views showing a part of the manufacturing processes of the chip resistor shown in FIG. 14;

FIG. 24 is a plan view showing the main parts of another example of the processes for manufacturing the chip resistor shown in FIG. 21;

FIG. 37 is a perspective view showing a conventional example of a chip resistor; and FIGS. 38A to 38E are illustrative views showing a conventional example of a chip resistor manufacturing method.

BEST MODES FOR CARRYING OUT THE INVENTION

Figure 1:
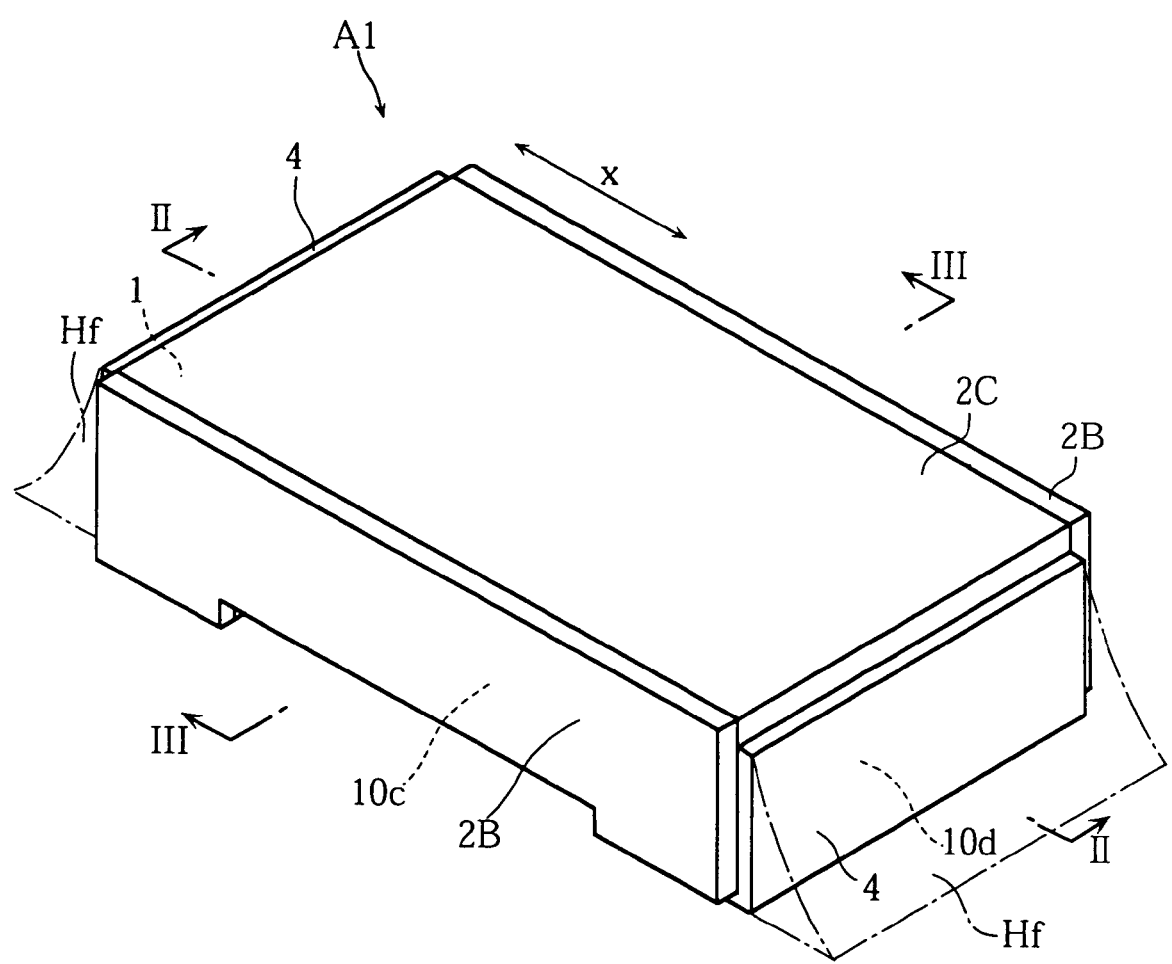
FIG. 1 is a perspective view showing an example of a chip resistor according to the present invention.

Preferred embodiments of the present invention will be described below specifically, with reference to the drawings.

FIGS. 1 to 4 show an example of the chip resistor according to the present invention. As is shown clearly in the drawings, a chip resistor A1 of this embodiment comprises a resistor 1, first through third insulation layers 2A to 2C, a pair of electrodes 3, and a pair of solder layers 4.

The resistor 1 is formed from metal in a rectangular chip form when seen from above. Specific examples of the materials used for the resistor 1 include an Ni—Cu alloy, a Cu—Mn alloy, and an Ni—Cr alloy. Note, however, that the material is not limited to these examples, and a material having a resistivity which is suited to the size and target resistance value of the chip resistor A1 may be selected appropriately.

The first through third insulation layers 2A to 2C are all resin films formed from epoxy resin or the like, and are formed by thick film printing, as will be described below. The first insulation layer 2A is formed so as to cover the entire region between the electrode pair 3 on a rear surface 10a of the resistor 1. The second insulation layer 2B is formed so as to cover the entirety of a pair of side faces 10c separated from each other in the width direction of the resistor 1. The third insulation layer 2C is provided so as to cover the entirety of a front surface 10b of the resistor 1.

Figure 2:
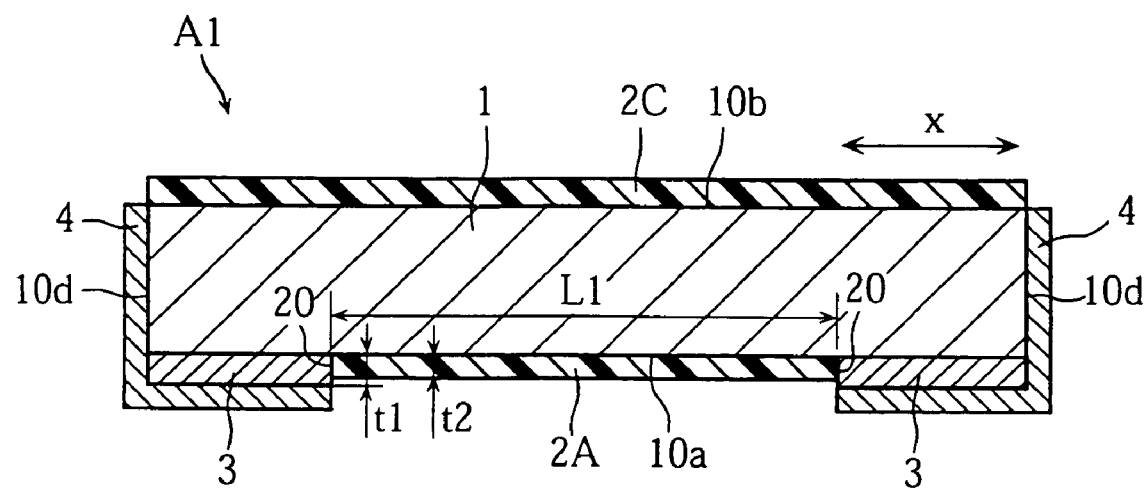
FIG. 2 is a sectional view along a line II-II of FIG. 1.
Figure 3:
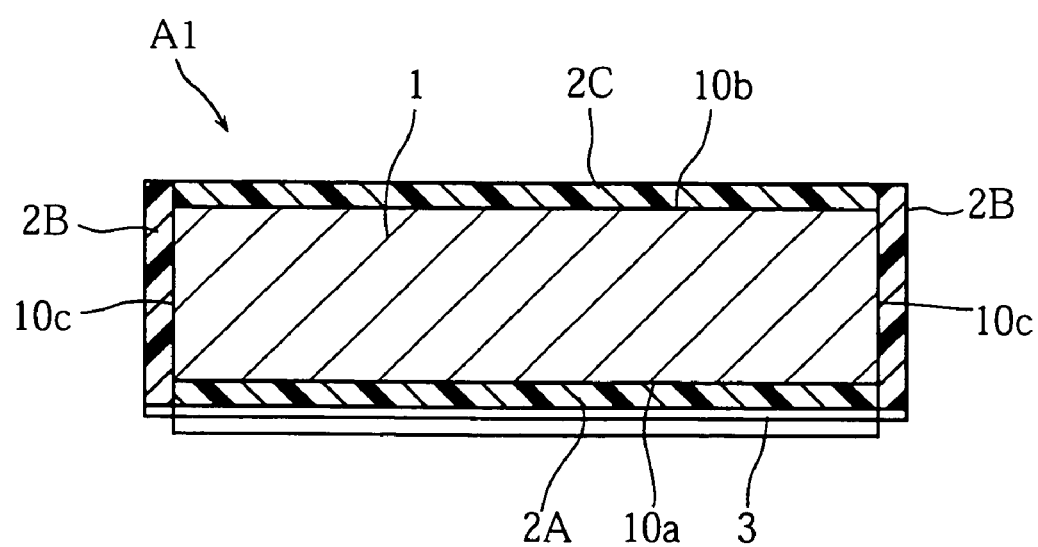
FIG. 3 is a sectional view along a line III-III of FIG. 1.
Figure 4:
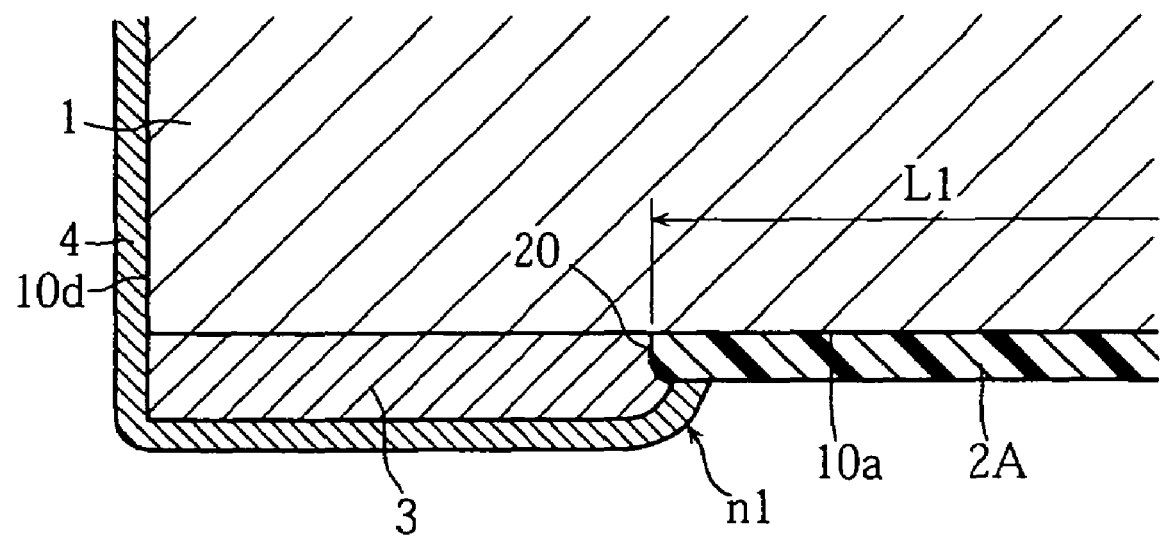
FIG. 4 is a sectional view of the main parts of the chip resistor shown in FIG. 1.

The electrode pair 3 is provided on the rear surface 10a of the resistor 1. The electrodes 3 are separated from each other in the length direction (x direction) of the resistor 1 so as to sandwich the first insulation layer 2A. As will be described below, each electrode 3 is formed by copper plating processing, for example, following the formation of the first insulation layer 2A such that no gap is formed between the electrodes 3 and end faces 20 of the first insulation layer 2A. In so doing, the gap between the electrode pair 3 is defined by the first insulation layer 2A, and hence has an equal dimension to a width L1 of the insulation layer 2A. In FIG. 2, FIG. 3, and FIG. 5 onward, the electrodes 3 and end portions of the solder layers 4 are illustrated in outline, but in actual fact, the electrodes 3 and solder layers 4 are formed from plating, and hence partially overlap the first insulation layer 2A, as shown by the reference symbol n1 in FIG. 4. Note, however, that this overlapping part itself does not contact the rear surface 10a of the resistor 1 directly, and therefore does not cause an error between the resistance values of the electrodes in the resistor 1. Hence when forming the electrodes 3 and solder layers 4, the amount of overlap may be comparatively large. A thickness t1 of each electrode 3 is set to be greater than a thickness t2 of the first insulation layer 2A such that the electrodes 3 protrude further downward than the lower surface of the first insulation layer 2A.

Each solder layer 4 has an L-shaped cross section, as shown in FIG. 2, in which a part covering the entirety of end faces 10d at the two end portions of the resistor 1 in the length direction is connected integrally to a part covering the entire lower surface of the electrodes 3. There are no particular limitations on the material of the solder layers 4, and various solders used in mounting and joining applications for electronic components may be employed.

To cite examples of the size of each portion of the chip resistor A1, the resistor 1 has a thickness of approximately 0.1 mm to 1 mm, and length and width dimensions of approximately 2 mm to 7 mm respectively. The thickness of the first through third insulation layers 2A to 2C is approximately 20 μm respectively, the thickness of each electrode 3 is approximately 30 μm, and the thickness of each solder layer 4 is approximately 5 μm. The resistance between the electrodes of the chip resistor A1 is determined according to the resistivity of the resistor 1, the distance between the electrodes 3, and the thickness of the resistor 1. Accordingly, the size of the resistor 1 is modified in various ways according to the magnitude of the target resistance value. The chip resistor A1 is constituted with a low resistance of approximately 0.5 mΩ to 100 mΩ, for example.

Next, an example of a manufacturing method of the chip resistor A1 described above will be described with reference to FIGS. 5 through 7.

Figure 5A:
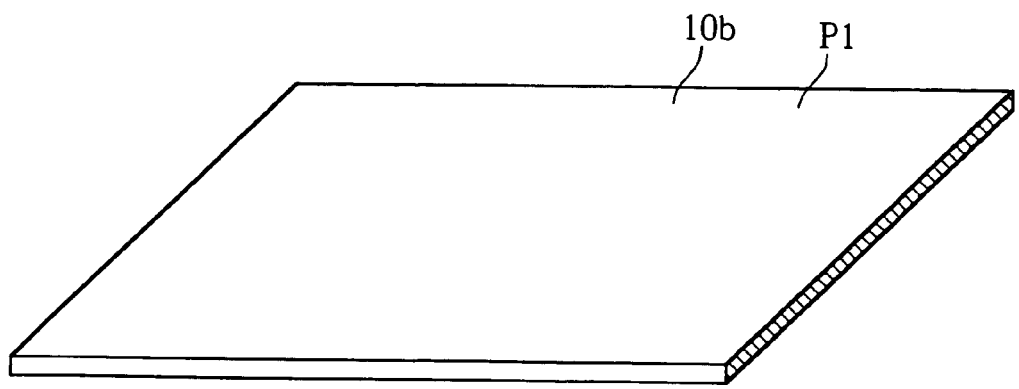
FIGS. 5A to 5C are perspective views showing a part of the manufacturing processes of the chip resistor shown in FIG. 1.
Figure 5B:
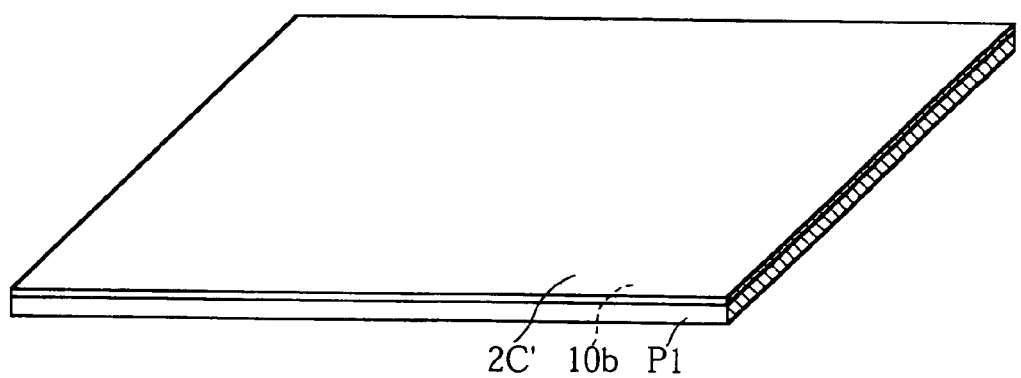

First, as shown in FIG. 5A, a metal plate P1 which serves as the material of the resistor 1 is prepared. The plate P1 has length and width dimensions enabling a plurality of the resistors 1 to be formed, and a uniform thickness. As shown in FIG. 5B, an insulation layer 2C' is formed over the entirety or the substantial entirety of an upward-facing surface 10b of the plate P1. The insulation layer 2C' is formed by a thick film printing process, for example, in which epoxy resin is coated uniformly. Following the formation of the insulation layer 2C', a process for printing a trademark on the surface thereof may be performed.

Figure 5C:
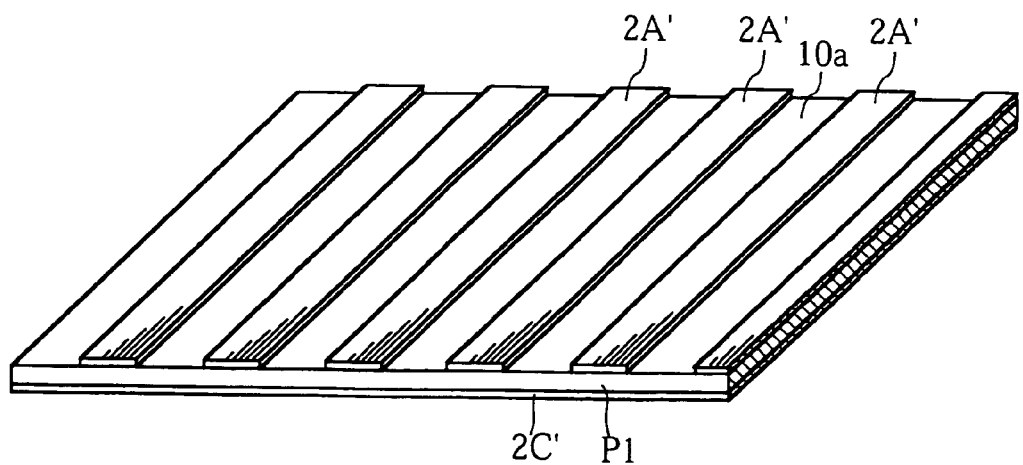

Next, as shown in FIG. 5C, the plate P1 is turned over, whereupon a surface 10a of the plate P1 which now faces upward is formed with a plurality of insulation layers 2A' arranged in striped form. The plurality of insulation layers 2A' is formed by thick film printing using the same resin and apparatus as those used to form the insulation layer 2C'. In so doing, the manufacturing cost of the chip resistor A1 can be reduced in comparison with a case in which a plurality of types of materials and apparatuses is used. By employing a thick film printing method, the width and so on of each insulation layer 2A' can be set accurately to predetermined dimensions.

Figure 6D:
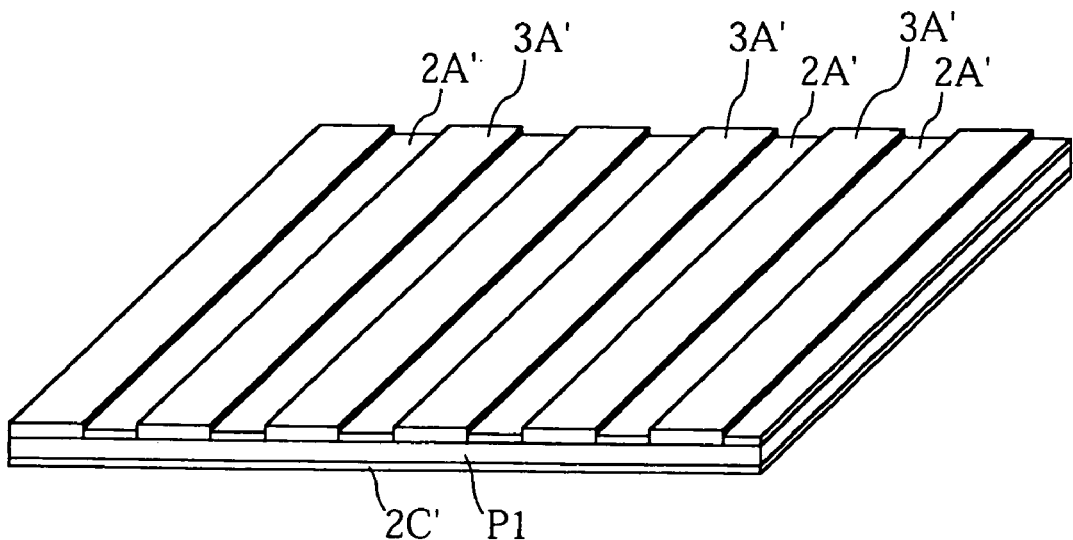
FIGS. 6D to 6F are perspective views showing a part of the manufacturing processes of the chip resistor shown in FIG. 1.

Following the formation of the plurality of insulation layers 2A', conductive layers 3A' are formed between the plurality of insulation layers 2A' on the surface 10a of the plate P1, as shown in FIG. 6D. The conductive layers 3A' serve as the original form of the electrodes 3, and are formed by copper plating, for example. When plating processing is used, all of the conductive layers 3A' can be formed at a uniform thickness, ensuring that no gaps appear between the conductive layers 3A' and insulation layers 2A'.

Figure 6E:
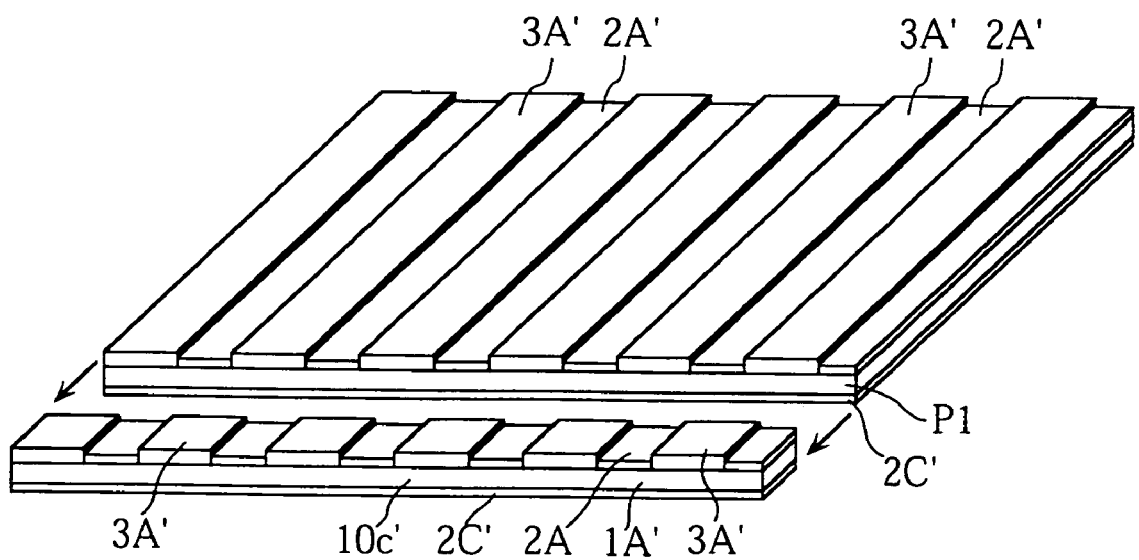

Next, as shown in FIG. 6E, the plate P1 is cut in an orthogonal direction to the direction in which the conductive layers 3A' and insulation layers 2A' extend. By means of this cutting operation, the plate P1 is divided into a plurality of bar-form resistor materials 1A'. The insulation layers 2A' and conductive layers 3A', cut into rectangular form, are provided on the upper surface of the resistor material 1A' in series, alternating in the length direction of the resistor materials 1A'. The insulation layer 2C', cut into an elongated form, is formed on the lower surface of the resistor material 1A'.

Figure 6F:
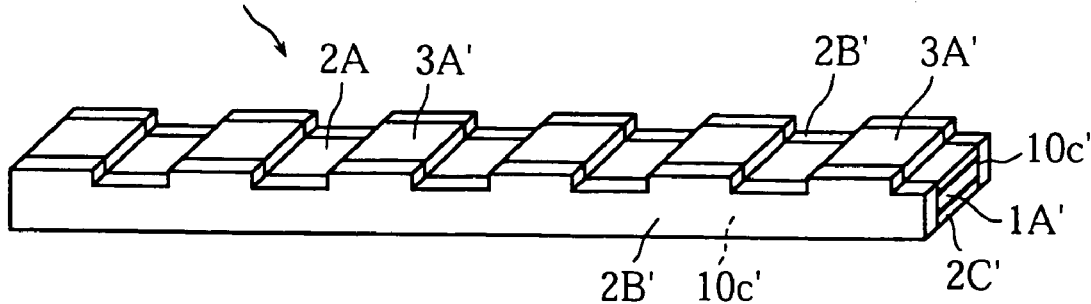

As shown in FIG. 6F, an insulation layer 2B' is formed by resin coating on a pair of side faces 10c' of the resistor material 1A' and the side faces of each conductive layer 3A'. This coating process may also be performed by thick film printing. Thus the insulation layer 2B' is prepared, and a bar-form resistor aggregate A1" as yet unformed with solder layers is obtained.

Figure 7G:
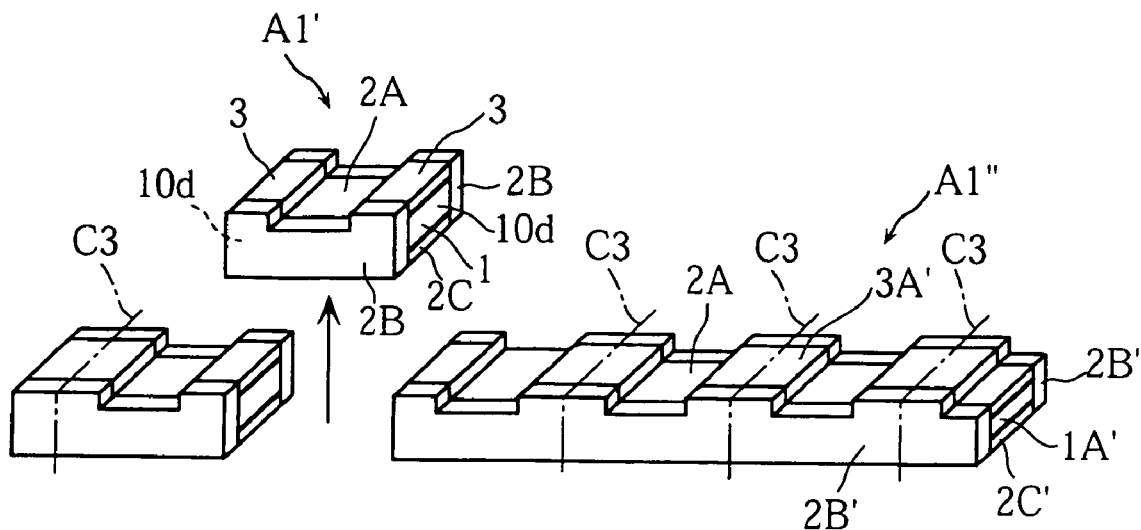
FIGS. 7G and 7H are perspective views showing a part of the manufacturing processes of the chip resistor shown in FIG. 1.

Next, as shown in FIG. 7G, the resistor aggregate A1" is cut along virtual lines C3 in a plurality of locations in the length direction thereof. This cutting operation is performed in positions which divide each conductive layer 3A' into two. As a result, the bar-form resistor material 1A' is divided into the chip-form resistors 1. The conductive layers 3A' and insulation layers 2B', 2C' form the electrodes 3 and the second and third insulation layers 2B, 2C, respectively, and thus a plurality of chip resistors A1' is manufactured favorably from the single bar-form resistor aggregate A1". Note that the chip resistor A1' is not yet formed with the solder layers 4, and therefore processing is performed subsequently to form the solder layers 4.

Figure 7H:
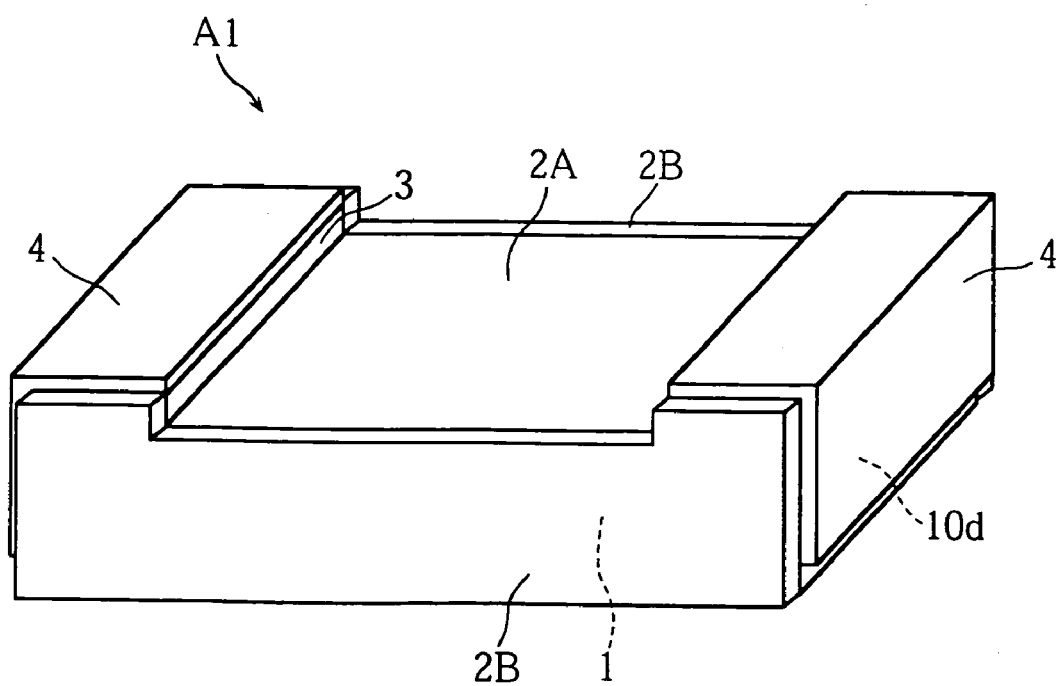

The solder layers 4 are formed by barrel plating, for example. In other words, after manufacturing the plurality of chip resistors A1', the plurality of chip resistors A1' is accommodated in a single barrel, where barrel plating processing is implemented on the plurality of chip resistors A1' simultaneously. Each chip resistor A1' is constituted such that the end faces 10d of the resistor 1 and the surface of each electrode 3 are exposed metallic surfaces, whereas the other parts are covered appropriately by the first through third insulation layers 2A to 2C, and hence, as shown in FIG. 7H, the solder layers 4 can be formed efficiently and appropriately in the regions of these metallic surfaces. As a result, the chip resistor A1 can be manufactured efficiently.

Next, an action of the chip resistor A1 will be described.

First, the chip resistor A1 is surface-mounted on a desired mounting region using a solder reflow method, for example. In this solder reflow method, cream solder is coated onto terminals provided on the mounting region, the chip resistor A1 is placed on the cream solder so that the electrodes 3 contact the cream solder, and then the device is heated in a reflow oven. Since the electrodes 3 protrude further downward than the first insulating layer 2A, the solder is adhered securely to the lower surface of the electrodes 3.

During solder reflow, the solder of the solder layers 4 melts. A part of the solder layers 4 is formed on the end faces 10d of the resistor 1, and therefore a solder fillet Hf such as that shown by the virtual lines in FIG. 1 is formed appropriately on the end faces 10d. Hence it is possible to determine that the chip resistor A1 has been mounted appropriately by confirming the presence of the solder fillet Hf from the exterior, and as a result, inspection is facilitated. The mounting strength of the chip resistor A1 increases in accordance with the formation of the solder fillet Hf. The solder fillet Hf serves to transmit the heat generated during electrification of the chip resistor A1 to the mounted members. Therefore, by forming the solder fillet Hf, an effect of suppressing temperature increases in the chip resistor A1 is also obtained. Since the solder layers 4 are also formed on the lower surface of the electrodes 3, the electrodes 3 can be soldered securely to the aforementioned terminals.

During this surface mounting operation, the solder may seep out from the terminals. However, the region between the electrodes 3 on the rear surface 10a of the resistor 1 and the side faces 10c of the resistor 1 are covered by the first and second insulation layers 2A, 2B, and therefore the solder does not adhere to these surfaces of the resistor 1 directly. Accordingly, resistance value errors caused by improper adhesion of the solder to the resistor 1 do not occur. The surface 10b of the resistor 1 is covered by the third insulation layer 2C, and hence improper electric conduction between this surface 10b and other members or devices can also be prevented.

The resistor 1 of the chip resistor A1 is formed by cutting the plate P1, and hence the size of the resistor 1 can be set with a high degree of precision. The thickness of the resistor 1 can be set accurately at the stage of the plate P1. The dimension L1 between the electrode pair 3 matches the width of the first insulation layer 2A, and the first insulation layer 2A can be formed to an extremely high degree of dimensional precision through thick film printing. Accordingly, the dimension L1 can also be set precisely to the desired dimension. By setting the size of the resistor 1 and the dimension L1 between the electrode pair 3 with such a high degree of precision, the error between the resistance values of the electrodes of the chip resistor A1 can be reduced greatly. Hence, following the manufacture of the chip resistor A1, the need to perform trimming in order to adjust the resistance value can be eliminated, and costs can be reduced correspondingly.

Unlike the prior art, during manufacture of the chip resistor A1 there is no need to form the pair of electrodes by implementing a cutting process on a part of a metal plate. Therefore, the manufacturing operation is also efficient. This enables a further reduction in the cost of the chip resistor A1.

Figure 8A:
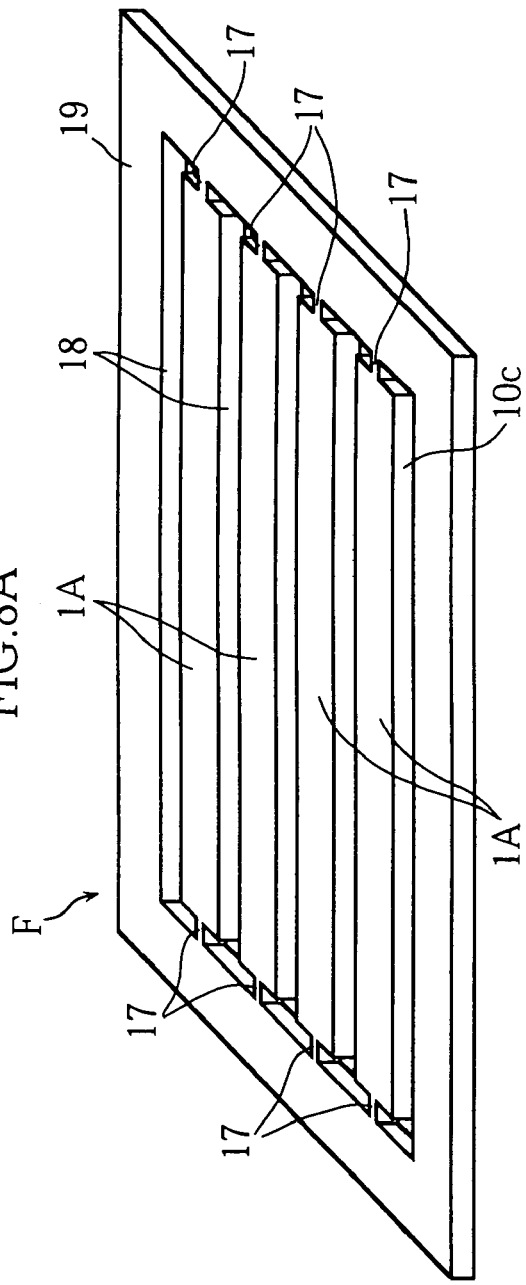
FIG. 8A is a perspective view showing an example of a frame used in the manufacture of the chip resistor.
Figure 8B:
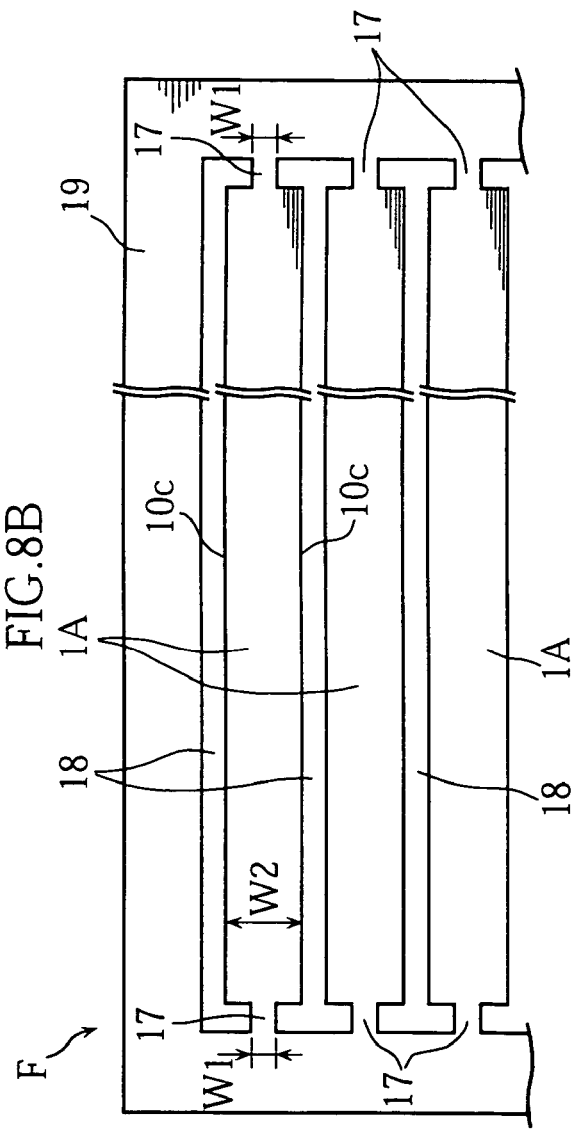
FIG. 8B is a plan view of the main parts thereof.

FIGS. 8A and 8B show an example of a frame which is suitable for use in the manufacture of the chip resistor. From FIG. 8 onward, identical or similar elements to those of the embodiment described above are allocated the same reference symbols as the embodiment described above.

In the present invention, the chip resistor A1 or a chip resistor having a similar structure may be manufactured using a frame F shown in FIGS. 8A and 8B. First, the constitution of the frame F will be described.

The frame F is made of metal, and comprises a rectangular frame-form support portion 19, and a plurality of plate-form portions 1A supported by the support portion 19. An appropriately sized through hole (not shown) used to fix the frame F in position in a desired location may be provided in the support portion 19. Each plate-form portion 1A eventually serves as the resistor of the chip resistor, and accordingly takes a rectangular form with a constant width and thickness over the entirety of the length direction. The plurality of plate-form portions 1A is arranged substantially parallel to the width direction of the plate-form portions 1A via a plurality of slits 18 formed in the frame F. A width W1 of connecting portions 17 connecting the two end portions of the plate-form portions 1A in the length direction thereof to the support portion 19 is set to be smaller than a width W2 of each plate-form portion 1A.

The frame F may be manufactured from a metallic plate. More specifically, the frame F is obtained by punching a plate P2 such as that shown in FIG. 9 in order to form the plurality of slits 18, for example. The slits 18 may be formed by etching processing, for example, rather than punching, and various other means may be employed to form the slits 18. In FIG. 8A, only four of the plate-form portions 1A are provided in the frame F, but this is simply to facilitate understanding, and a large number of the plate-form portions 1A is provided in a single frame F in order to enhance the productivity of the chip resistor.

Next, a method of manufacturing a chip resistor using the frame F will be described with reference to FIGS. 10 through 13.

First, as shown in FIG. 10A, the insulation layer 2C' is formed over the entire upward-facing surface 10b of each plate-form portion 1A. In the drawing, the insulation layer 2C' is also formed on the support portion 19, but need not be formed on the support portion 19. The insulation layer 2C' is formed through thick film printing in which an epoxy resin, for example, is coated uniformly. Next, as shown in FIG. 10B, the frame F is turned over, whereupon the surface 10a of each plate-form portion 1A which now faces upward is formed with a plurality of the insulation layers 2A arranged at fixed intervals in the length direction of the plate-form portions 1A. Each insulation layer 2A takes a rectangular form with an equal width to the plate-form portions 1A. The insulation layers 2A are formed by thick film printing using the same resin and apparatus as those used to form the insulation layer 2C'.

Figure 11C:
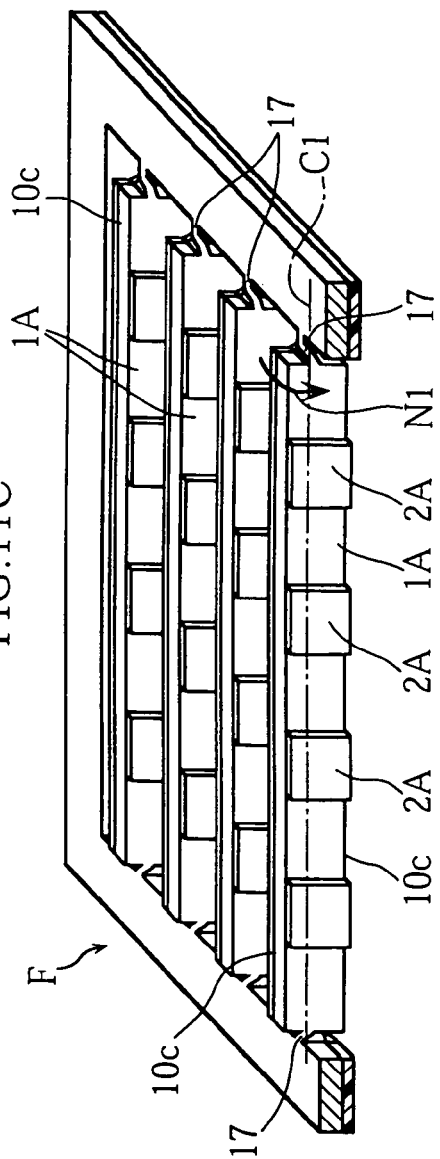
FIGS. 11C and 11D show a part of the processes for manufacturing the chip resistor using the frame, FIG. 11C being a partially cut-away perspective view, and FIG. 11D being a partial sectional side view.
Figure 11D:
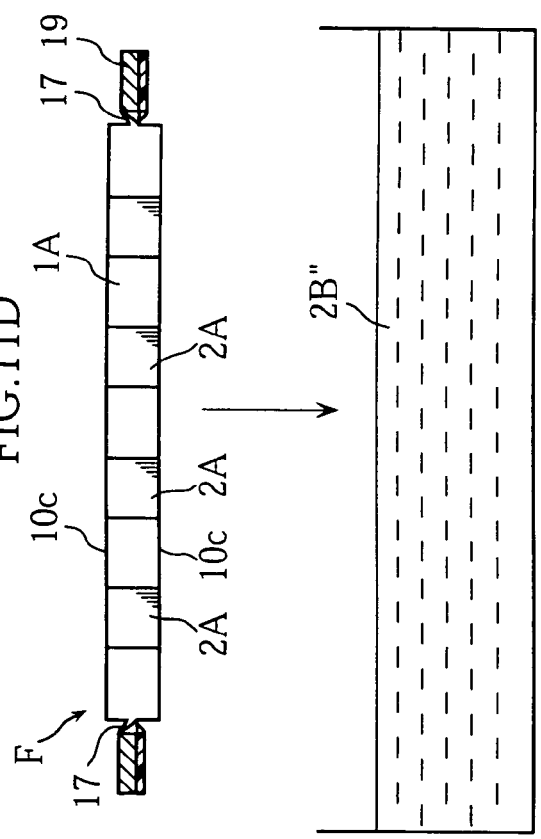
Figure 12E:
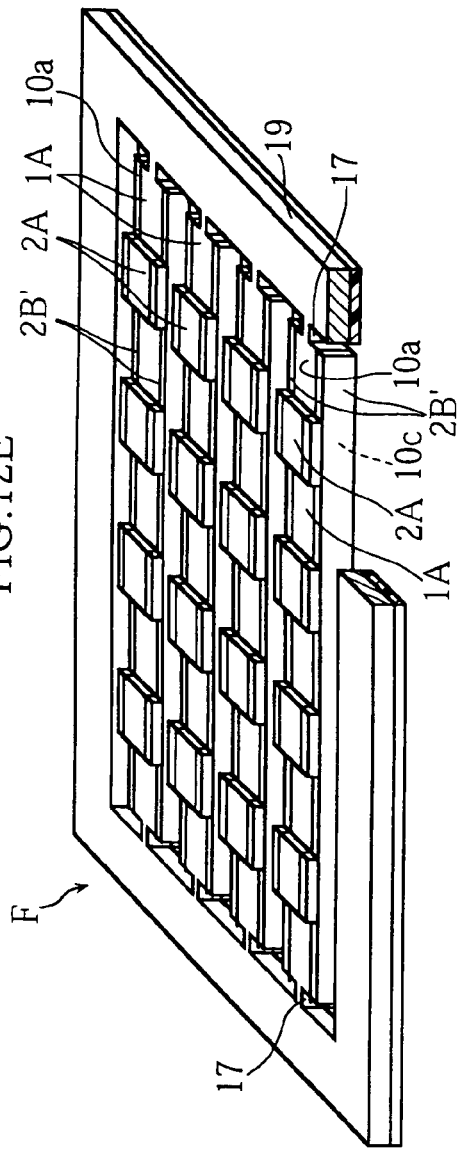
FIGS. 12E and 12F are partially cut-away perspective views showing apart of the processes for manufacturing the chip resistor using the frame.

Following the formation of the insulation layers 2A, each plate-form portion 1A is rotated substantially 90 degrees in the direction of an arrow N1 about an axis C1 extending in the length direction of the plate-form portions 1A, as shown in FIG. 1C. This rotation is performed by twisting the connecting portions 17 so that the connecting portions 17 deform. Since the connecting portions 17 are narrower than the plate-form portions 1A, the connecting portions 17 can be twisted and deformed easily, and hence the plate-form portions 1A can be rotated easily. By rotating the plate-form portions 1A in this manner, the pair of side faces 10c become oriented differently and change position so as to protrude upward from the front surface of the support portion 19 or protrude downward from the rear surface of the support portion 19. Thus, by bringing the side faces 10c of the plate-form portions 1A into contact with a liquid coating 2B" used to form an insulation film as shown in FIG. 11D, the operation to coat the side faces 10c with the coating 2B" can be performed easily and appropriately. By drying and hardening the coated coating 2B", the insulation layer 2B' is formed appropriately on the pair of side faces 10c of each plate-form portion 1A, as shown in FIG. 12E. After forming the insulation layer 2B', the plate-form portions 1A are rotated back to their original attitude. Note, however, that subsequent operations to form the electrodes and cut the plate-form portions 1A may be implemented with the plate-form portions 1A in the rotated state shown in FIG. 11C. In so doing, the process to return the plate-form portions 1A to their original attitude can be eliminated, enabling a reduction in the overall number of processes.

Figure 12F:
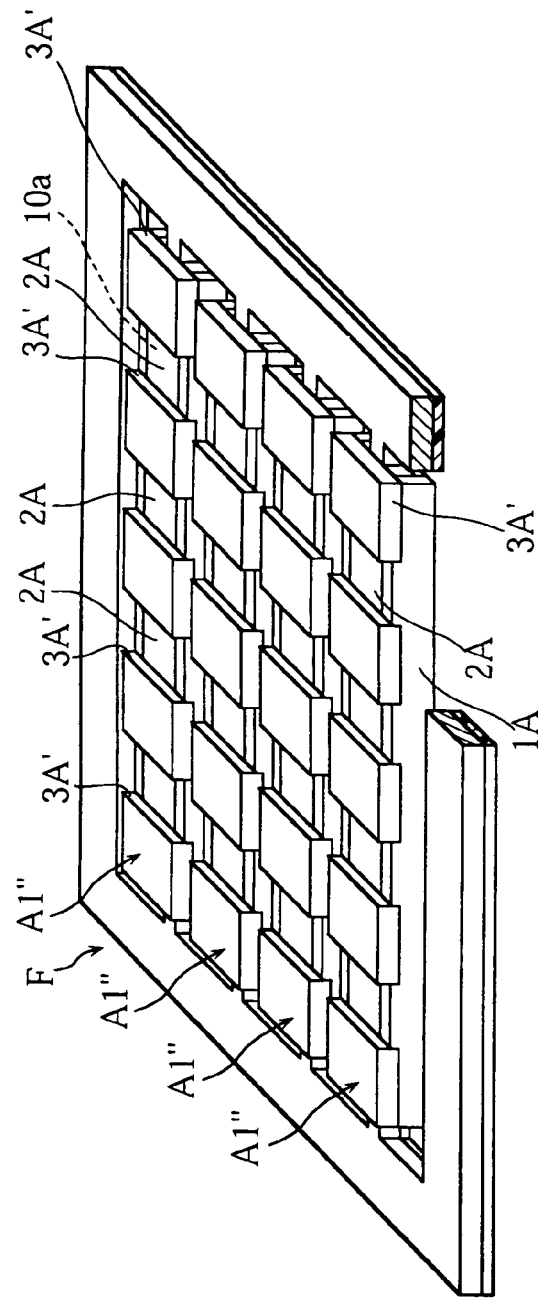

Next, as shown in FIG. 12F, the conductive layers 3A' serving as electrodes are formed in each region between the insulation layers 2A on the surface 10a of each plate-form portion 1A. The conductive layers 3A' are formed by copper plating, for example, and the thickness thereof is set to be greater than the thickness of the insulation layers 2A. By forming the conductive layers 3A', bar-form resistor aggregates A1", corresponding to chip resistors without solder layers connected integrally in the length direction of the plate-form portions 1A, are obtained. Next, as shown in FIG. 13, the bar-form resistor aggregates A1" are cut in the locations shown by virtual lines C2 in the drawing. By means of this cutting operation, the conductive layers 3A' are divided into the two electrodes 3, and a part of the plate-form portions 1A becomes the chip-form resistor 1. Further, the insulation layers 2B', 2C' become the second and third insulation layers 2B, 2C, and thus a plurality of the chip resistors A1' is obtained. Note, however, that the chip resistors A1' are not yet formed with solder layers. Hence the solder layers are then formed on the end faces 10d of the resistor 1 and the electrodes 3 similarly to the embodiment described above using a barrel plating method, for example. As a result, a chip resistor having a similar structure to the chip resistor A1 shown in FIGS. 1 to 3 is manufactured favorably. Note that in this embodiment, as shown in FIG. 13, the side faces of the electrodes 3 are covered by the second insulation layer 2A, and hence a solder layer is also formed in this part. This is preferable for forming a large solder fillet.

When the frame F is used as the raw material of the chip resistor in the manner described above, in contrast to a case in which a rectangular plate is used as the raw material, the process of cutting the plate into bar-form members is not required, and hence the manufacturing operation is facilitated correspondingly. Furthermore, by using the method shown in FIGS. 11C and 11D when forming the insulation layers 2B' on the side faces 10c of the plurality of plate-form portions 1A, the insulation layers 2B' can be formed on the plurality of plate-form portions 1A at one time, which is more favorable in terms of workability than a case in which the insulation layers 2B' are formed successively using a thick film printing method.

FIGS. 14 to 36 illustrate other embodiments of the present invention.

Figure 14:
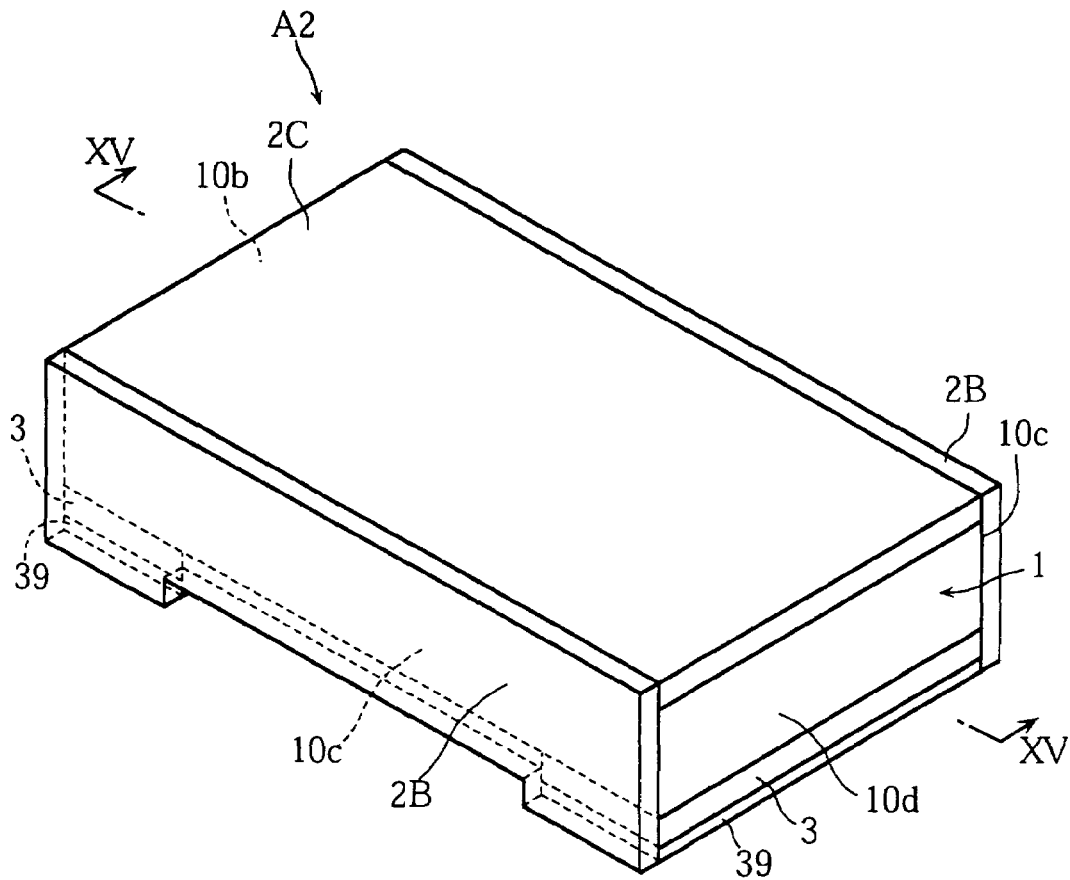
FIG. 14 is a perspective view showing another example of the chip resistor according to the present invention.
Figure 15:
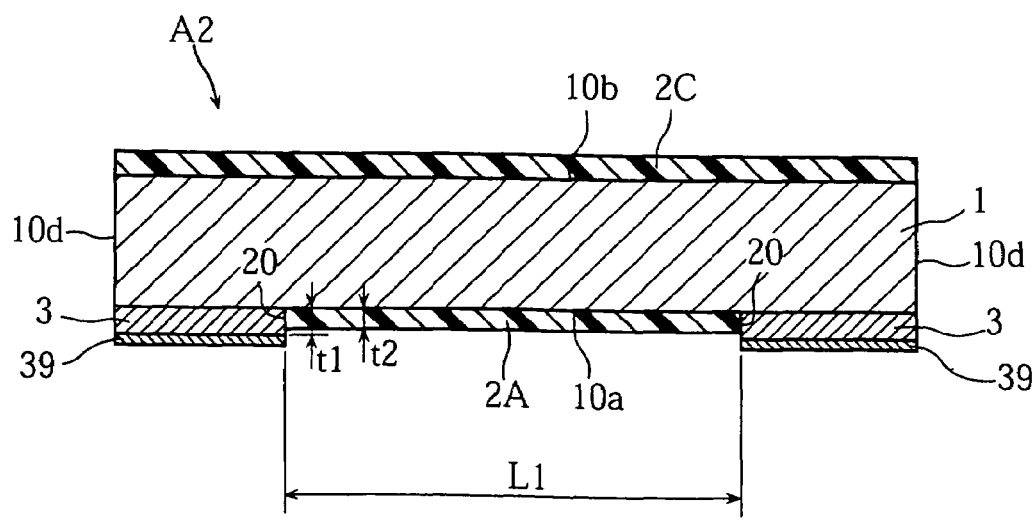
FIG. 15 is a sectional view along a line XV-XV of FIG. 14.

A chip resistor A2 shown in FIGS. 14 and 15 is constituted such that no solder layer is formed on the end faces 10d of the resistor 1, and a solder layer 39 is formed only on the lower surface of each electrode 3. In comparison with the chip resistor A1 described above, it is more difficult to form a large solder fillet on this chip resistor A2 due to the absence of a solder layer on the end faces 10d. However, similarly to the chip resistor A1, solder can be prevented from adhering improperly to the rear surface 10a and the two side faces 10c of the resistor 1 by the first and second insulation layers 2A, 2B, and hence the amount of solder used to mount the chip resistor A2 can be increased, enabling the formation of a solder fillet. The solder layer 39 is useful for improving solder ability during mounting.

FIGS. 16 and 17 show an example of the manufacturing method of this chip resistor A2.

Figure 16A:
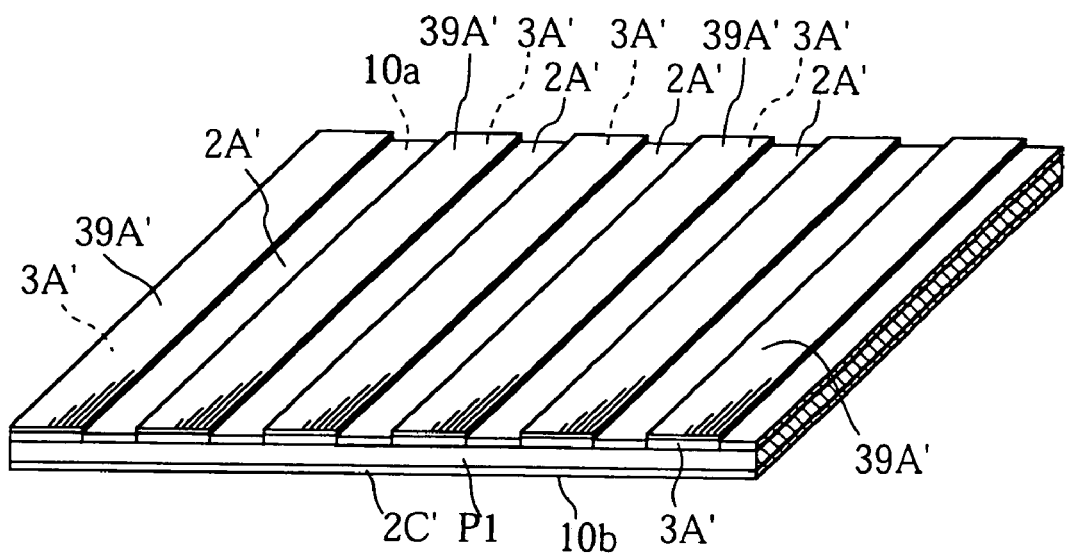
FIGS. 16A and 16B are perspective views showing a part of the manufacturing processes of the chip resistor shown in FIG. 14.

In this manufacturing method, first an intermediate component such as that shown in FIG. 16A is produced. This intermediate component is constituted by forming the insulation layer 2C' on the surface 10b of the plate P1 and forming the striped insulation layers 2A' on the opposite surface 10a of the plate P1. The conductive layer 3A' and a solder layer 39A' are formed successively between each insulation layer 2A'. Excluding the solder layers 39A', this intermediate component has an identical constitution to the component shown in FIG. 6D, and similar methods to those described above may be employed to obtain this constitution. The solder layers 39A' are formed by a plating processing method, for example. The parts of the front and rear surfaces of the plate P1 other than the conductive layers 3A' are covered by the resin insulation layers 2A', 2C', and hence the solder layers 39A' can be formed appropriately on the front surface part of the conductive layers 3A'.

Figure 16B:
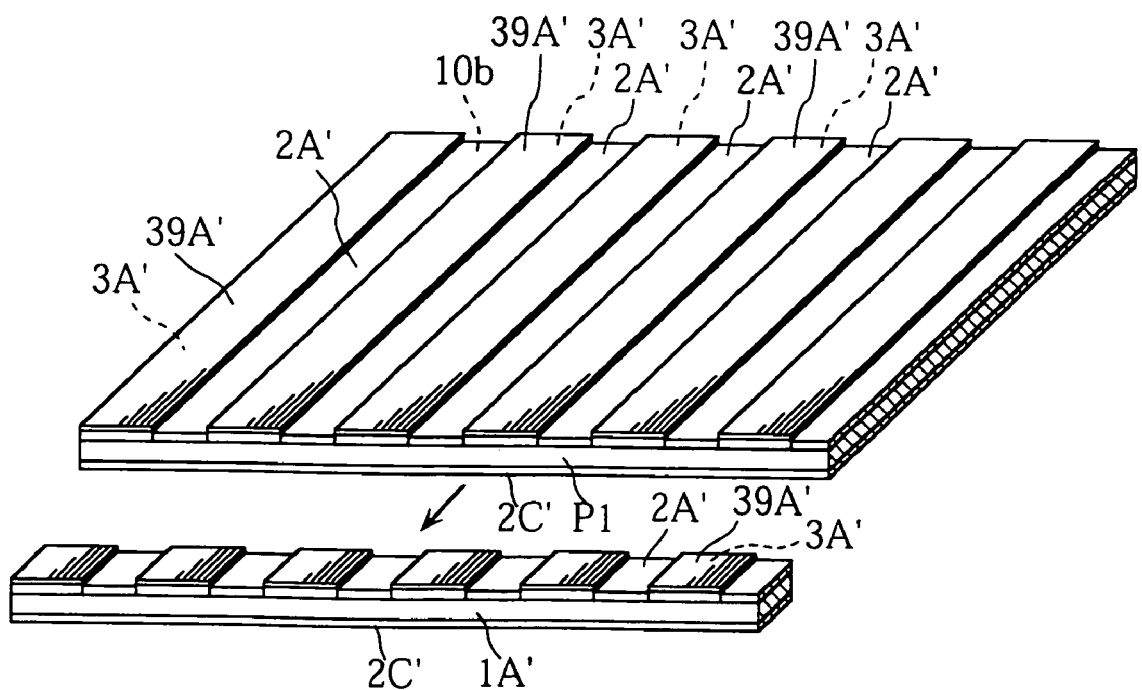

Once this intermediate component has been produced, the plate P1 is cut in an orthogonal direction to the direction in which the conductive layers 3A' and first insulation layers 2A' extend, as shown in FIG. 16B, and thus the plate P1 is divided into a plurality of the bar-form resistor materials 1A'. Next, as shown in FIG. 17C, resin coating and so on are performed on the pair of side faces 10c of each bar-form resistor material 1A' to form the second insulation layers 2B'. As a result, a bar-form resistor aggregate A2' corresponding to a series of connected chip resistors A2 is obtained. Next, as shown in FIG. 17D, the resistor aggregate A2' is cut in a plurality of locations shown by the virtual lines, and thus divided into a plurality of chips. As a result, the conductive layers 3A' become the electrodes 3 of the chip resistor A2, and a plurality of the chip resistors A2 is manufactured favorably.

Figure 18:
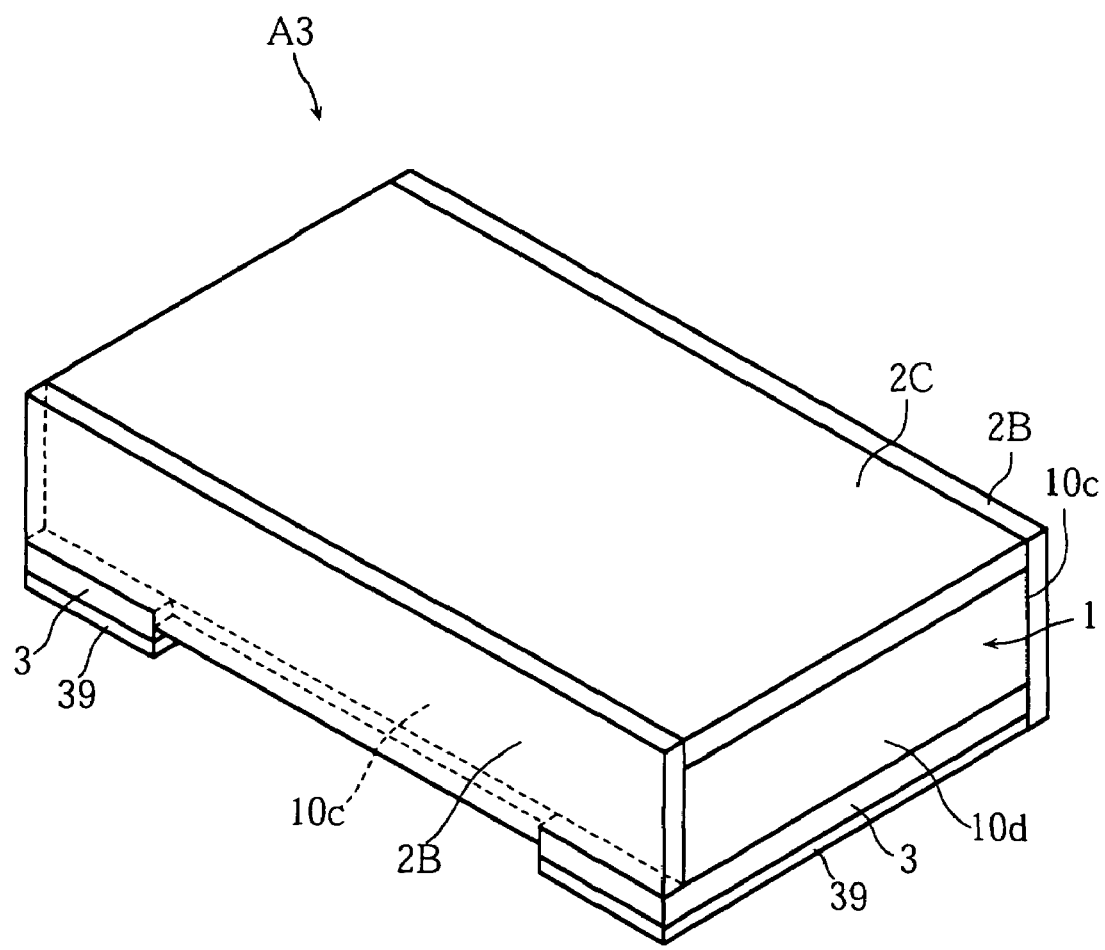
FIG. 18 is a perspective view showing another example of the chip resistor according to the present invention.

A chip resistor A3 shown in FIG. 18 differs from the chip resistor A2 described above in that the second insulation layer 2B does not cover the electrodes 3 and the side faces of the solder layer 39, but is otherwise identical to the chip resistor A2 constitutionally.

Figure 19A:
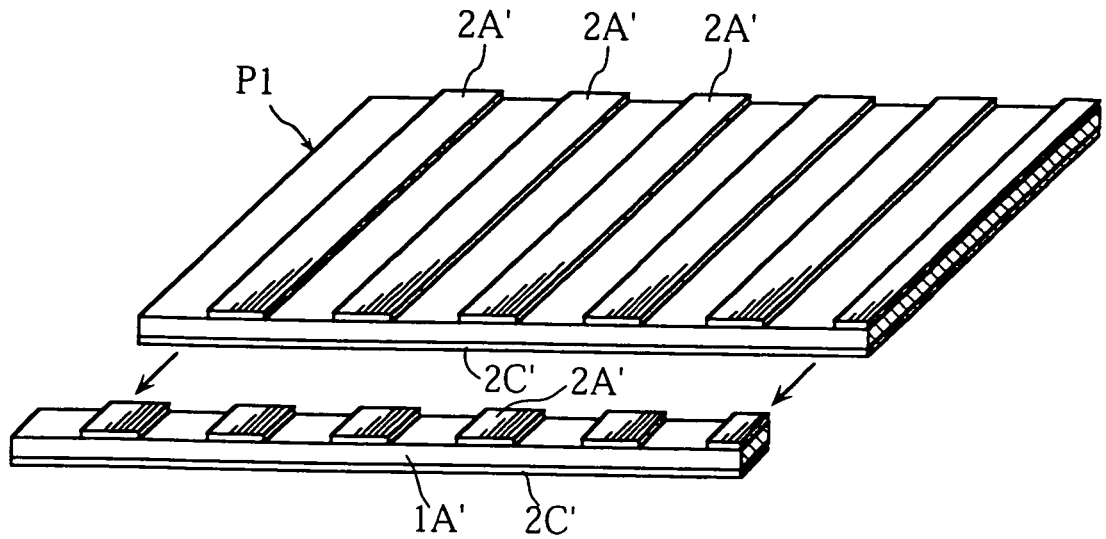
FIGS. 19A to 19D are perspective views showing a part of the manufacturing processes of the chip resistor shown in FIG. 18.
Figure 19B:
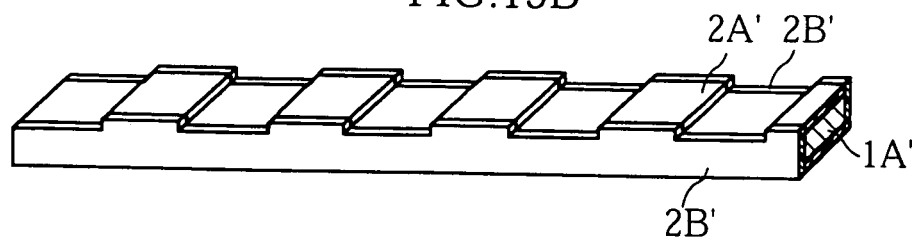
Figure 19C:
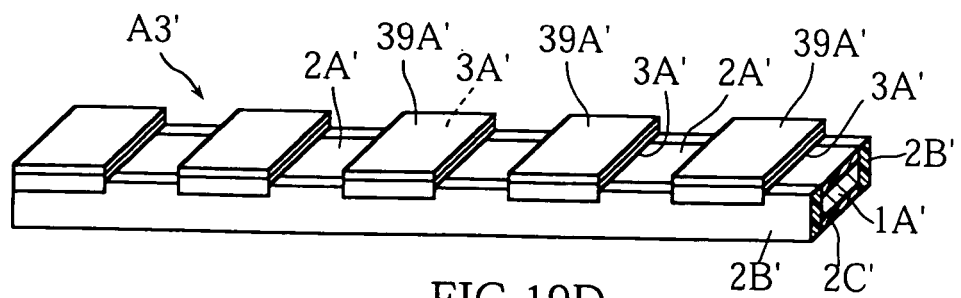
Figure 19D:
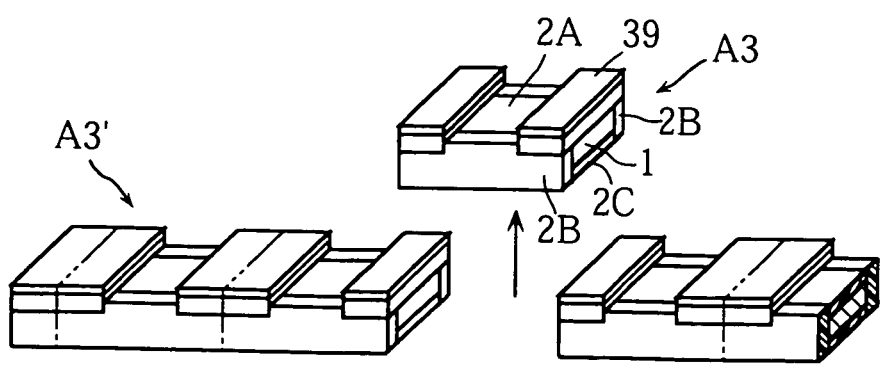

The chip resistor A3 may be manufactured by processes such as those shown in FIGS. 19A to 19D, for example. First, as shown in FIG. 19A, the insulation layers 2A' are formed in striped form on one surface of the plate P1, and the insulation layer 2C' is coated uniformly onto the opposite surface, whereupon the plate P1 is cut into the bar-form resistor materials 1A'. Next, as shown in FIG. 19B, the insulation layer 2B' is formed on the pair of side faces of the resistor material 1A'. Then, as shown in FIG. 19C, the conductive layers 3A' and solder layers 39A' are formed in the regions between the insulation layers 2A'. As a result, a bar-form resistor aggregate A3' is obtained. Next, as shown in FIG. 19D, the resistor aggregate A3' is cut into a plurality of chips. By means of this cutting operation, the chip resistor A3 shown in FIG. 18 is obtained. A similar action to that described with regard to the chip resistor A2 is obtained in the chip resistor A3.

Figure 20A:
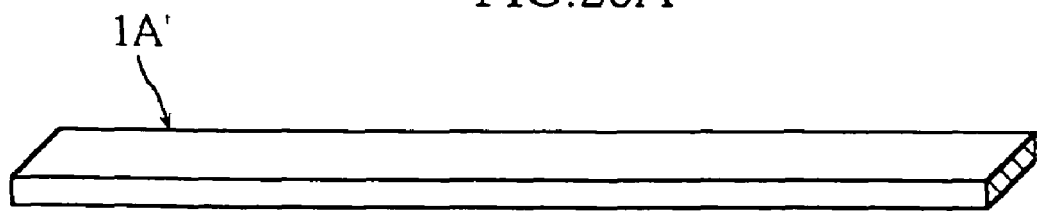
FIGS. 20A to 20C are perspective views showing another example of the processes for manufacturing the chip resistor shown in FIG. 18.
Figure 20B:
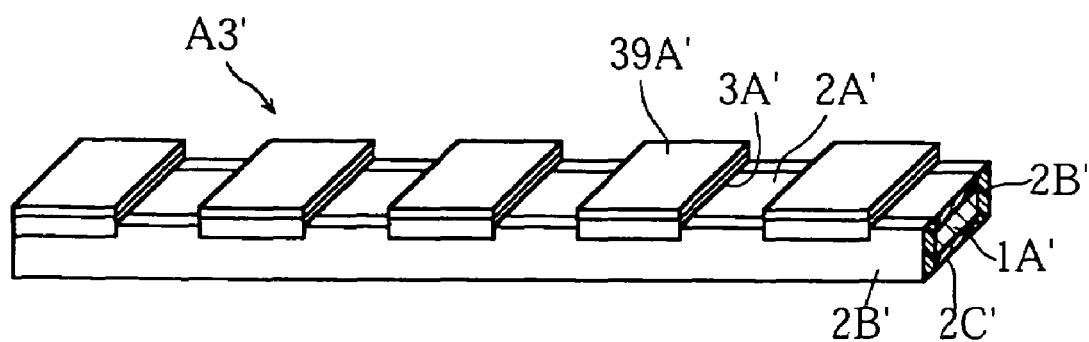
Figure 20C:
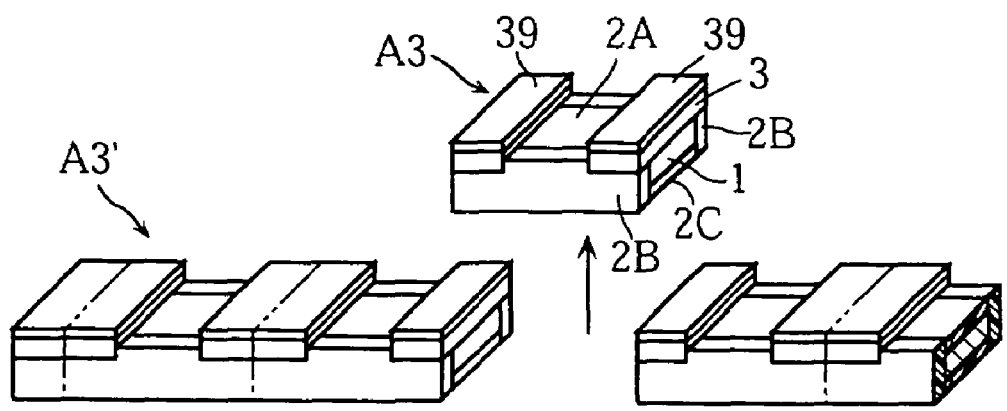

FIGS. 20A to 20C show another example of the manufacturing method of the chip resistor A2. In this manufacturing method, first the bar-form resistor material 1A' is prepared as shown in FIG. 20A. Next, as shown in FIG. 20B, the insulation layers 2A' to 2C' and the plurality of conductive layers 3A' and solder layers 39A' are formed on the resistor material 1A', thereby producing the resistor aggregate A3'. Next, as shown in FIG. 20C, the resistor aggregate A3' is cut into a plurality of the chip resistors A3. Hence in the present invention, a bar-form resistor material may be used instead of a plate-form resistor material or a frame such as that shown in FIGS. 8A and 8B when producing the resistor aggregate.

Figure 21:
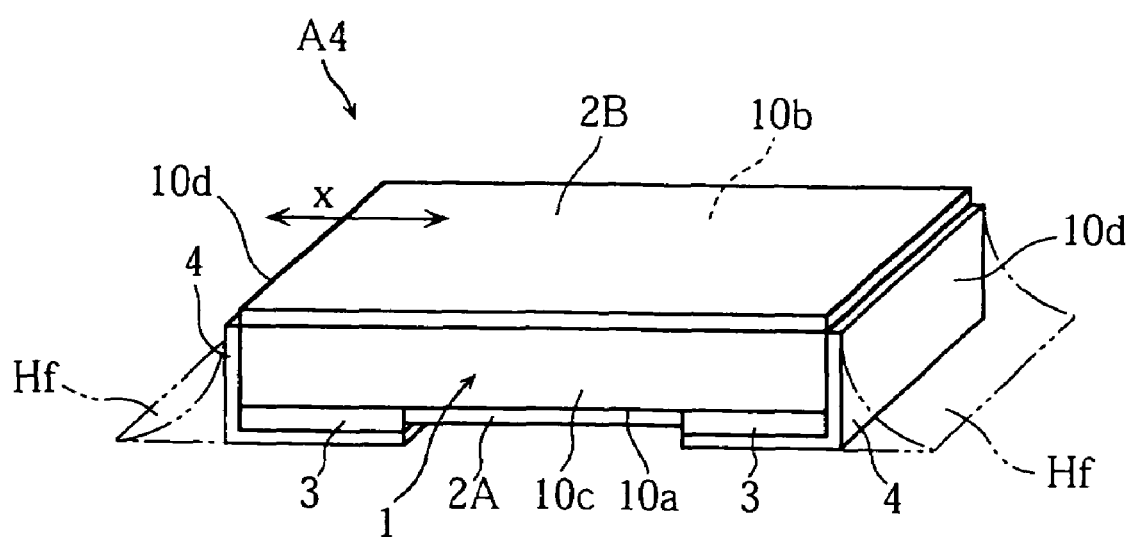
FIG. 21 is a perspective view showing another example of the chip resistor according to the present invention.

A chip resistor A4 shown in FIG. 21 is constituted such that the two side faces 10c of the resistor 1 are not covered by an insulation layer. However, the two end faces 10d of the resistor 1 and the lower surface of each electrode 3 are covered by the solder layers 4. An advantage of this chip resistor A4 is that large solder fillets Hf can be formed along the end faces 10d using the solder layers 4 when the chip resistor A4 is mounted in a desired location, similarly to the chip resistor A1 described above, and hence the present invention may also be constituted in this manner.

Figure 22A:
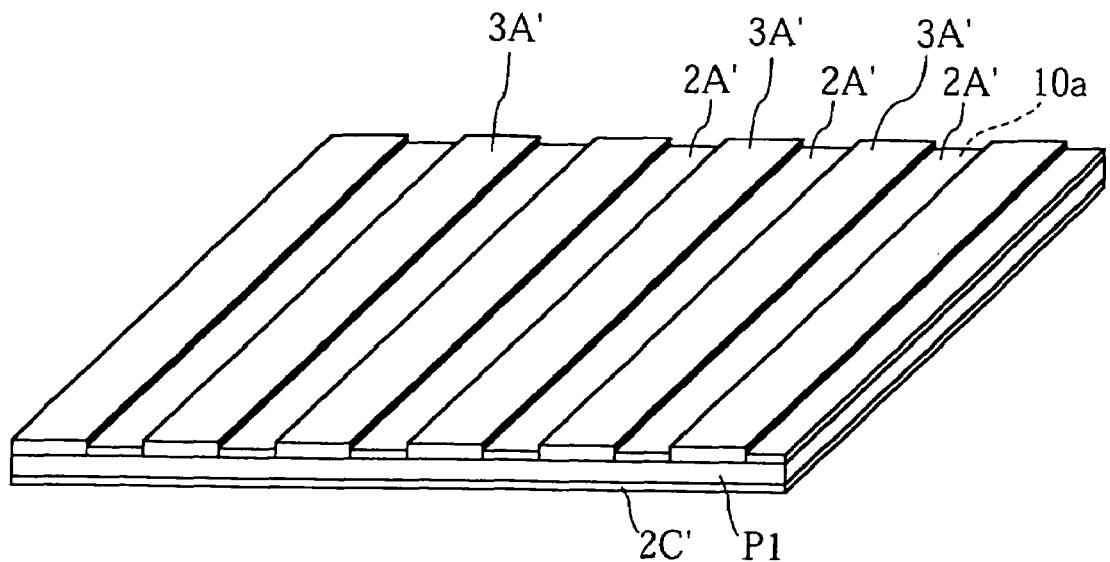
FIGS. 22A and 22B are perspective views showing a part of the manufacturing processes of the chip resistor shown in FIG. 21.
Figure 22B:
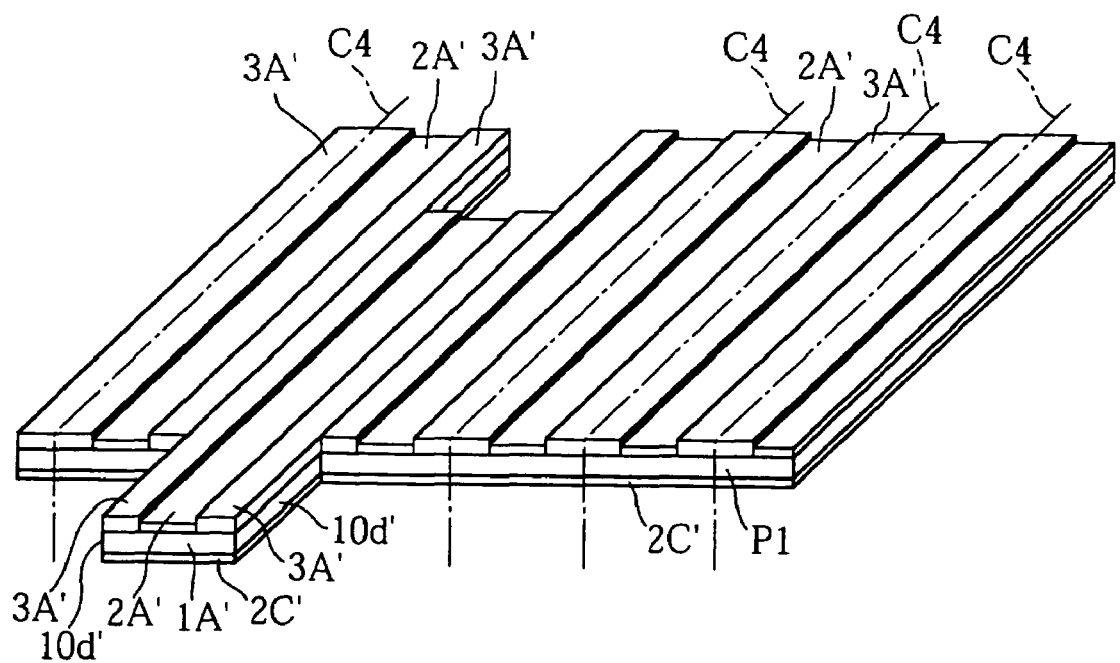

This chip resistor A4 may be manufactured by the following method. First an intermediate component such as that shown in FIG. 22A is prepared. This intermediate component is constituted identically to that shown in FIG. 6D. Next, as shown in FIG. 22B, the conductive layers 3A', plate P1, and insulation layer 2C' are cut in the locations shown by virtual lines C4. More specifically, cutting is performed in positions which divide the conductive layers 3A' into two in the width direction thereof, and in the extension direction of the conductive layers 3A' and insulation layers 2A'. By means of this cutting operation, the plate P1 is divided into a plurality of the bar-form resistor materials 1A', and hence a bar-form resistor aggregate as yet unformed with a solder layer is obtained. The bar-form resistor aggregate is constituted such that the insulation layers 2A' and the divided strip-form conductive layers 3A' are formed on one of the front and rear surfaces of the resistor material 1A', and such that the divided insulation layer 2C' is formed on the opposite surface. The resistor material 1A' comprises a pair of side faces 10d extending in the length direction which serve as cut faces.

Figure 23C:
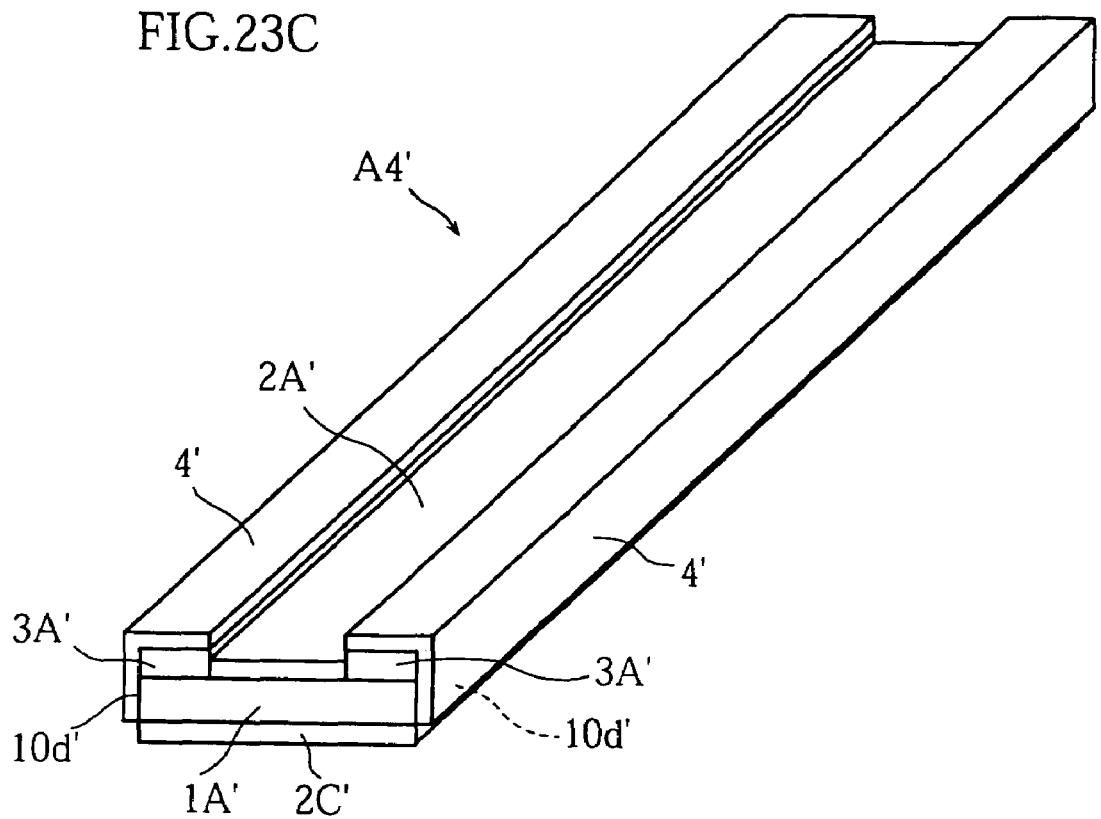
FIGS. 23C and 23D are perspective views showing a part of the manufacturing processes of the chip resistor shown in FIG. 21.
Figure 23D:
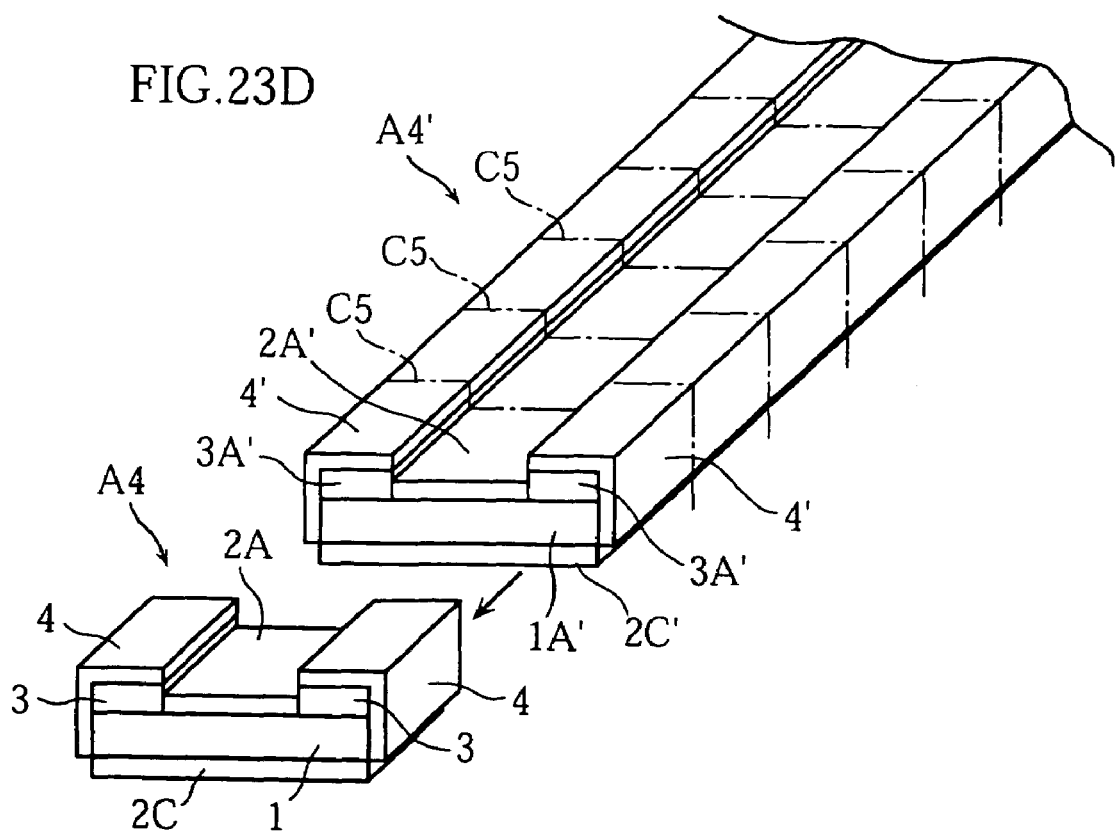

Next, as shown in FIG. 23C, solder layers 4' are formed on the pair of side faces 10d of the bar-form resistor material 1A' and the front surface of each conductive layer 3A' using a plating processing method, for example. As a result, a bar-form resistor aggregate A4' comprising the solder layers 4' is obtained. Once the resistor aggregate A4' has been obtained, the resistor aggregate A4' is cut in a plurality of locations along virtual lines C5, as shown in FIG. 23D. By means of this cutting operation, a plurality of the chip resistors A4 is manufactured favorably.

FIG. 24 shows another manufacturing method of the chip resistor A4.

In this manufacturing method, the frame F is used as the raw material of the resistor 1. The frame F is identical to that shown in FIGS. 8A and 8B. The strip-form insulation layers 2A', which extend in the length direction of the plate-form portions 1A, and the two strip-form conductive layers 3A' sandwiching each insulation layer 2A' (the parts shaded with a mesh pattern denote the conductive layers 3A') are formed on one surface of each plate-form portion 1A of the frame F. Further, the solder layers 4' are formed on the pair of side faces 10c' of each plate-form portion 1A. Although not shown in the drawing, the solder layers 4' may be formed to cover the front surface of the conductive layers 3A'. An insulation layer corresponding to the insulation layer 2C is formed on the opposite surface of the plate-form portions 1A to the aforementioned one surface. As a result of these processes, the bar-form resistor aggregate A4' is obtained. By cutting the resistor aggregate A4' in the locations of virtual lines C6, the chip resistors A4 are manufactured as shown by the virtual lines in the drawing.

Figure 25:
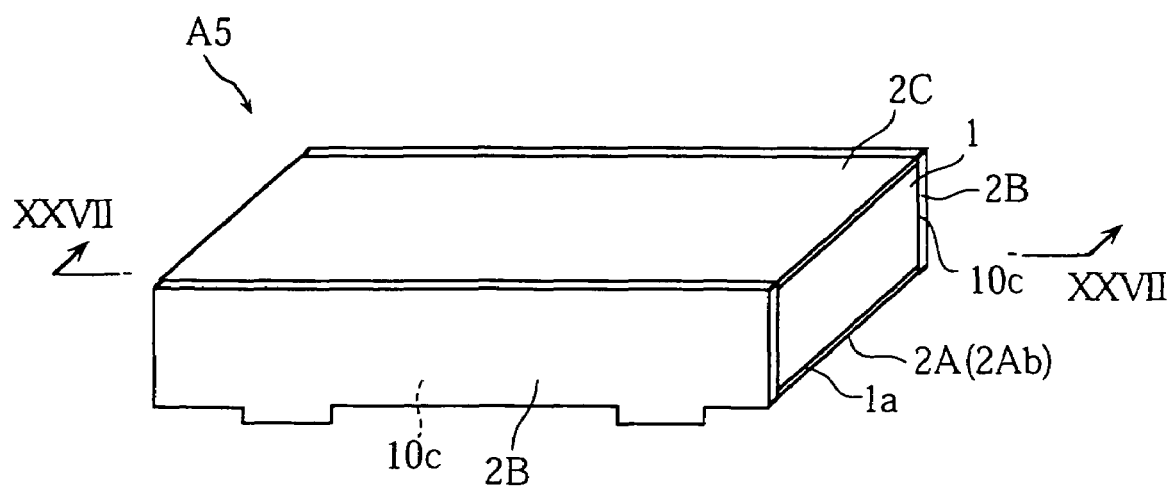
FIG. 25 is a perspective view showing another example of the chip resistor according to the present invention.
Figure 26:
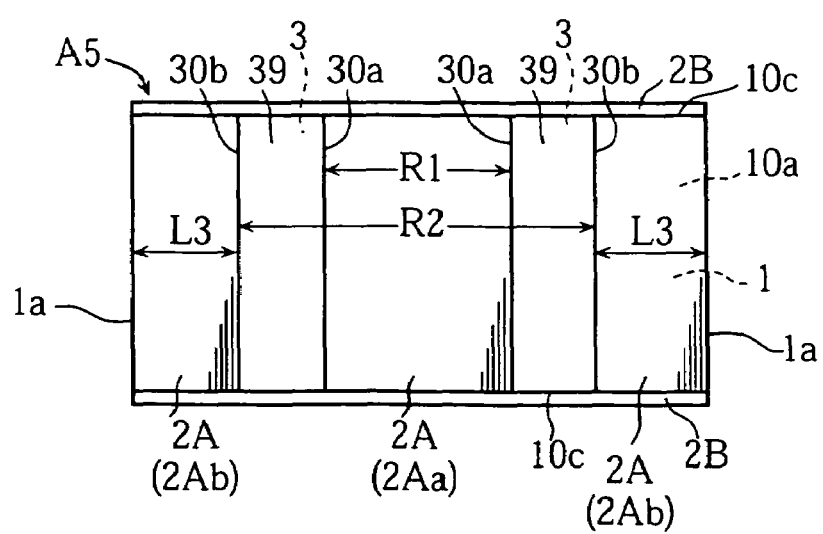
FIG. 26 is a bottom view of the chip resistor shown in FIG. 25.
Figure 27:
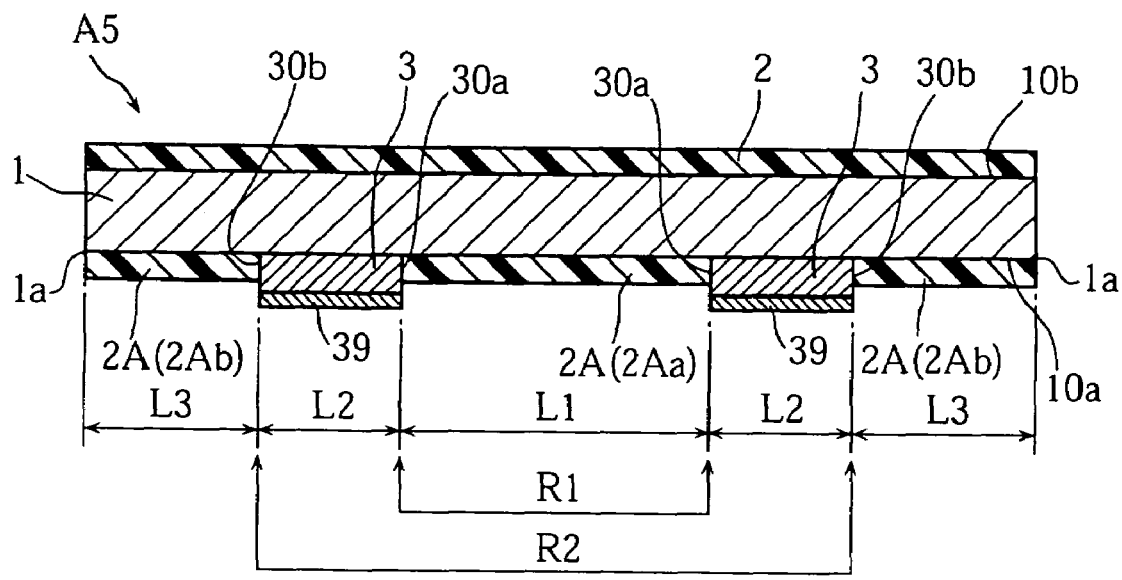
FIG. 27 is a sectional view along a line XXVII-XXVII of FIG. 25.

A chip resistor A5 shown in FIGS. 25 to 27 is constituted such that the pair of electrodes 3 is provided in positions removed from edges 1a of the rear surface 10a of the resistor 1 in the length direction thereof by an appropriate distance L3. An insulation layer 39 is formed on the lower surface of each electrode 3. The first insulation layer 2A is formed on the rear surface 10a of the resistor 1 so as to be divided into a region 2Aa covering the region between the electrode pair 3 and two regions 2Ab covering the remaining parts of the rear surface 10a.

In this chip resistor A5, the electrodes 3 are removed from the edges 1a of the rear surface 10a of the resistor 1 by the appropriate dimension L3, and hence the width L2 of the electrodes 3 is smaller than a case in which the electrodes 3 are formed so as to extend to the edges 1a of the resistor 1, for example. By reducing the width L2 of the electrodes 3 in this manner, the difference between a resistance value R1 between respective inside edge portions 30a of the electrode pair 3 and a resistance value R2 between outside edge portions 30b thereof is reduced. Hence when the chip resistor A5 is surface mounted in a desired location using solder, large differences in the resistance values can be prevented even when the solder is offset toward the inside edge portions 30a of the electrode pair 3 or offset toward the outside edge portions 30b of the electrode pair 3, for example. The difference between the resistance values R1, R2 may also be reduced by increasing the thickness of the electrodes 3 in order to lower their electrical resistance. In this embodiment, however, there is no need to increase the thickness of the electrodes 3 for this purpose, and therefore a thin chip resistor A5 can be obtained favorably.

Figure 28:
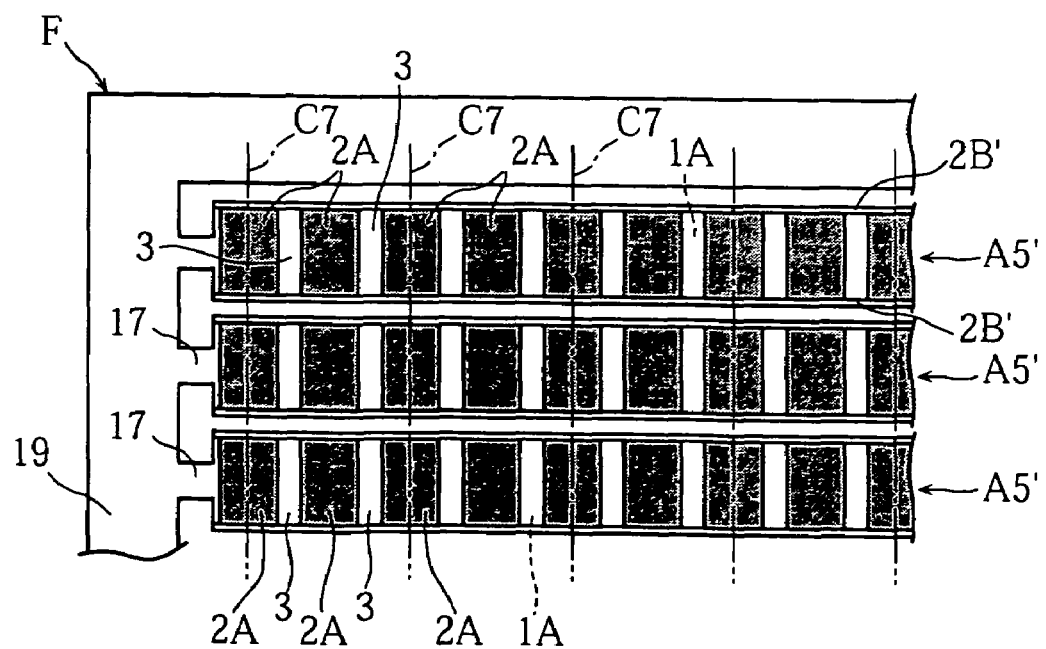
FIG. 28 is a plan view showing the main parts of an example of the processes for manufacturing the chip resistor shown in FIG. 25.

To manufacture the chip resistor A5 described above, a bar-form resistor aggregate A5' is formed by forming the plurality of insulation layers 2A at fixed intervals on one surface of the plate-form portions 1A of the frame F, and forming the electrodes 3 between each insulation layer 2A, as shown in FIG. 28, for example. The insulation layers 2B' serving as the second insulation layer 2B are formed on the pair of side faces 10c of each plate-form portion 1A, and an insulation layer serving as the third insulation layer 2C is formed on the opposite surface of the plate-form portions 1A to the aforementioned surface. The frame F is constituted similarly to that described with reference to FIGS. 8A and 8B, and a similar method to that described with reference to FIGS. 11C and 11D may be used as the formation method of the insulation layers 2B'. Once the resistor aggregate A5' has been produced, the resistor aggregate A5' is cut in a plurality of locations shown by virtual lines C7. As a result, a plurality of the chip resistors A5 is manufactured appropriately.

Figure 29:
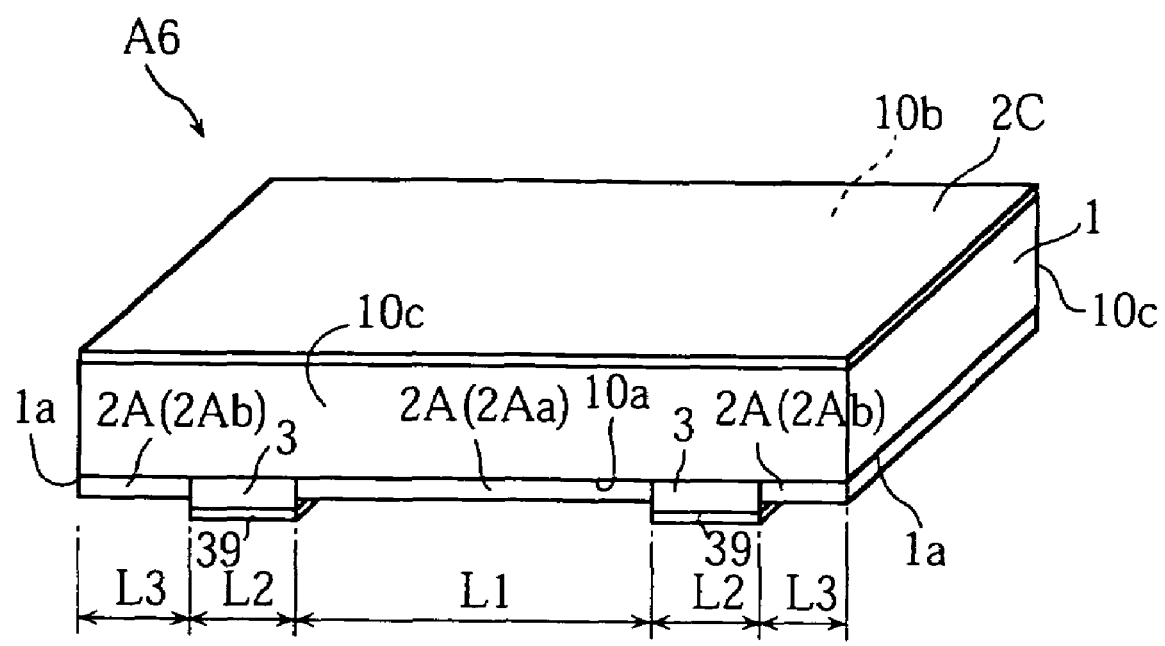
FIG. 29 is a perspective view showing another example of the chip resistor according to the present invention.

A chip resistor A6 shown in FIG. 29 is constituted such that the pair of side faces 10c of the resistor 1 is not covered by an insulation layer. The electrodes 3 of the chip resistor A6 are removed from the edges 1a of the rear surface 10a of the resistor 1 by the appropriate distance L3, and hence the width L2 of the electrodes 3 is reduced. Hence, similarly to the chip resistor A5 described above, the chip resistor A6 is advantaged in that the error between resistance values can be reduced even when the solder used during mounting is offset toward either the inside edge portions or outside edge portions of the electrodes 3. Accordingly, the present invention may have a constitution such as that of the chip resistor A6.

The chip resistor A6 differs from the chip resistor A5 only in that the second insulation layer 2B is not provided. Hence the chip resistor A6 can be manufactured easily using the manufacturing method described with reference to FIG. 28. Note, however, that in this case the insulation layers 2B' are not formed on the frame F.

Figure 30A:
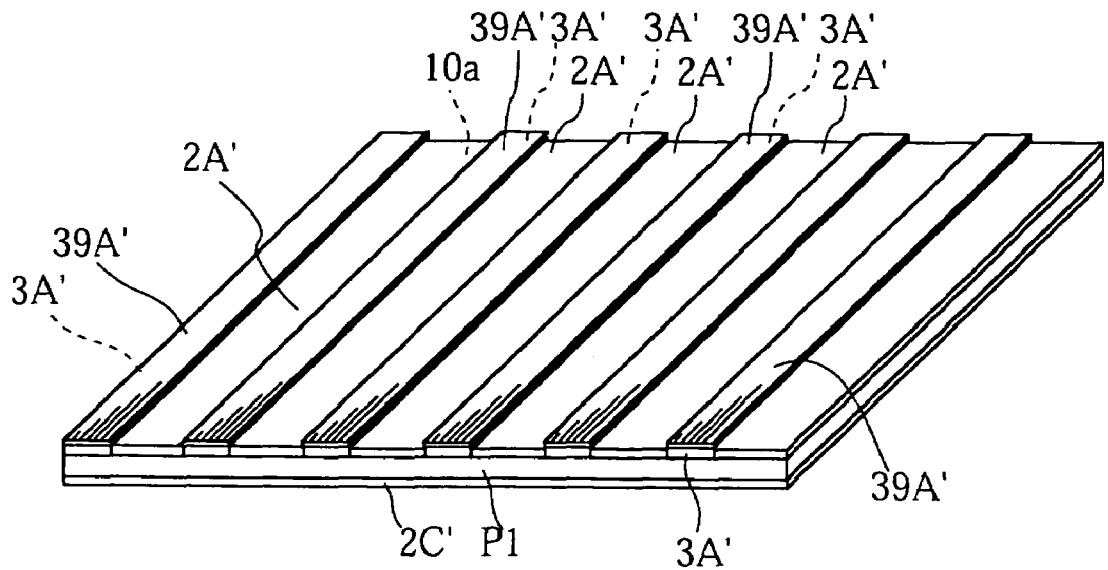
FIGS. 30A and 30B show a part of the manufacturing processes of the chip resistor shown in FIG. 29, FIG. 30A being a perspective view, and FIG. 30B being a plan view of the main parts thereof.
Figure 30B:
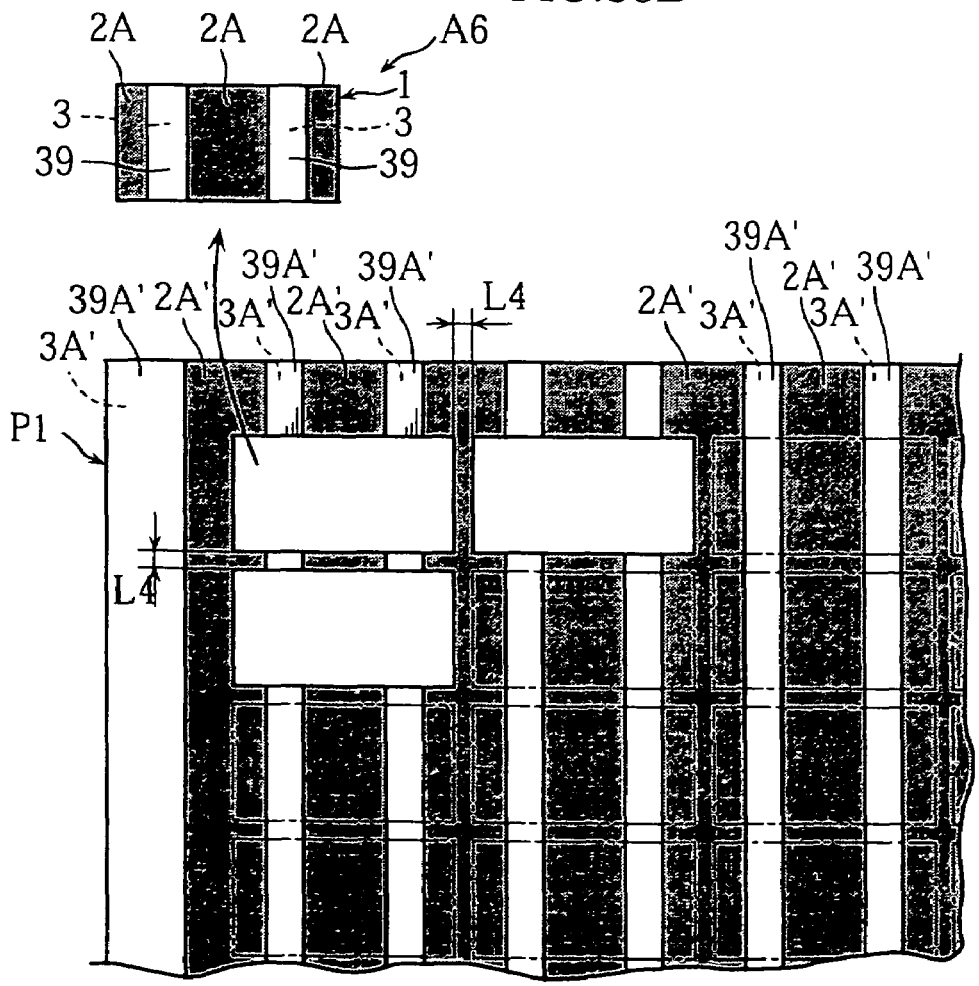

Further, a method such as the following may be used as another manufacturing method for the chip resistor A6. First, an intermediate component such as that shown in FIG. 30A is produced. This intermediate component is constituted identically to that shown in FIG. 16A, whereby the stripe-form plurality of insulation layers 2A', and the conductive layers 3A' and solder layers 39A' formed therebetween, are formed on the surface 10a of the plate P1. Punching (blanking) is implemented repeatedly on the intermediate component as shown in FIG. 30B to divide the plate P1 into a plurality of chip-form resistors 1 (in the drawing, the parts shaded with a mesh pattern correspond to the insulation layers 2A', likewise in subsequent drawings). In this punching operation, the plate P1 is punched such that respective parts of two adjacent conductive layers 3A' and solder layers 39A', apart of the single insulation layer 2A' sandwiched therebetween, and respective parts of the two insulation layers 2A' positioned on the two ends thereof remain on the surface of the resistor 1. By means of this punching operation, the respective parts of the two adjacent conductive layers 3A' form the pair of electrodes 3 on the chip resistor A6, and the parts of the insulation layers 2A' form the first insulation layer 2A. In FIG. 30B, the punching regions are illustrated by virtual lines, and punching of the plate P1 proceeds as shown in the drawing such that the plurality of punching regions line up in a matrix form with an appropriate interval L4 therebetween. In this manner, a plurality of the chip resistors A6 can be obtained appropriately from the plate P1.

As described above, a punching method may be employed as means for dividing the plate P1 into a plurality of the resistors 1. When punching means using a die are employed, the length and width dimensions of the resistor 1 can be set accurately in relation to the die with almost no errors. Furthermore, if the punching operation is performed repeatedly using a single punching die, manufacturing errors such as those in a case where a plurality of punching dies is used alternately, caused by variation in the dimensions of the plurality of punching dies, do not occur.

Figure 31A:
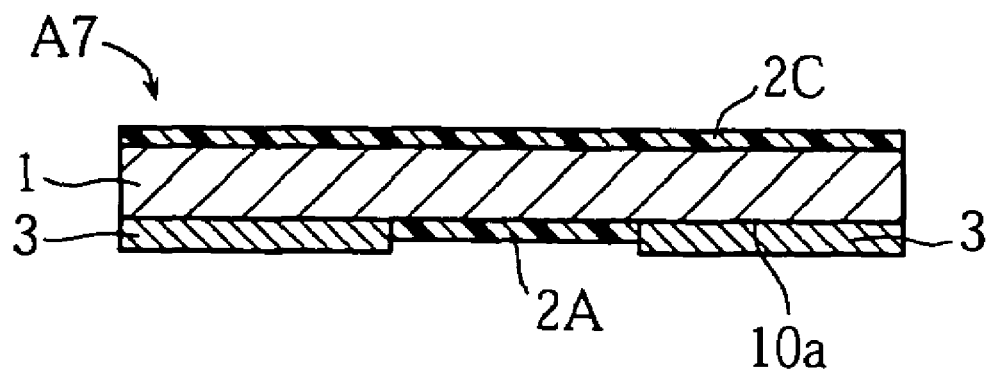
FIG. 31A is a sectional view showing another example of the chip resistor according to the present invention.
Figure 31B:
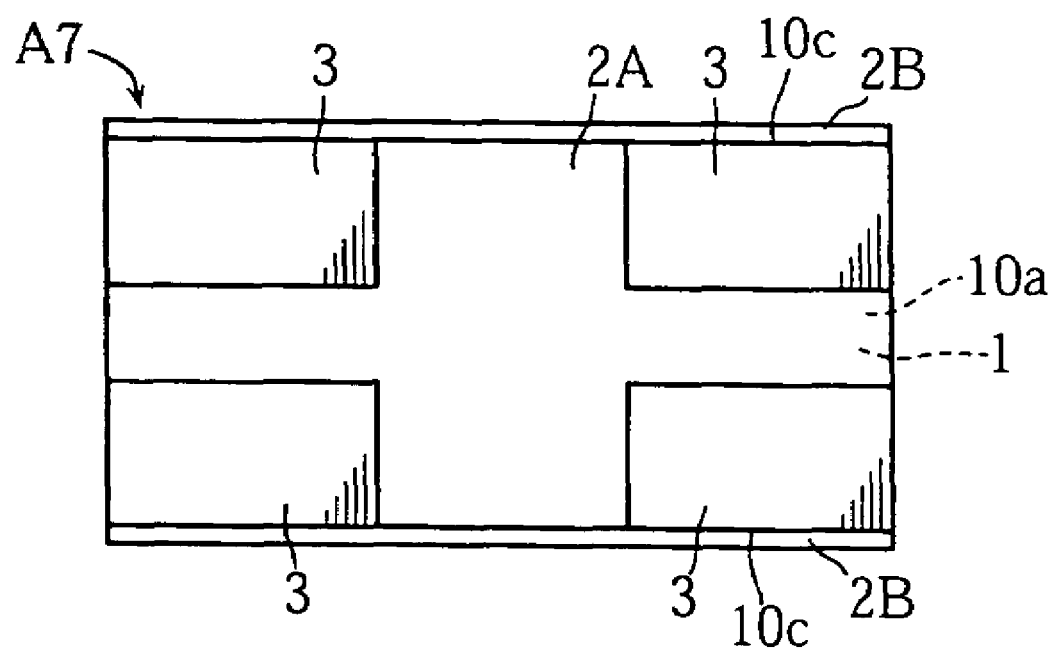
FIG. 31B is a bottom view thereof.

In a chip resistor A7 shown in FIGS. 31A and 31B, the first insulation layer 2A is formed in a substantial cross-shape such that four of the electrodes 3 are provided on the rear surface 10a of the resistor 1.

The chip resistor A7 may be used in the following manner, for example. From the four electrodes 3, two of the electrodes 3 are used as a pair of current electrodes, and the other two electrodes 3 are used as a pair of voltage electrodes. When detecting the current of an electric circuit, the pair of current electrodes 3 form an electric connection with the electric circuit such that the current of the electric circuit flows through the electrode pair 3. A voltmeter is connected to the pair of voltage electrodes 3. The resistance value of the chip resistor A7 is already known, and therefore by measuring voltage decreases in the resistor 1 of the chip resistor A7 using the voltmeter and applying the measurement value to an ohm formula, the value of the current flowing through the resistor 1 can be learned accurately. Since the four electrodes 3 are disposed symmetrically, defects can be prevented even when the chip resistor A7 is mounted at a 180° rotation.

Figure 32A:
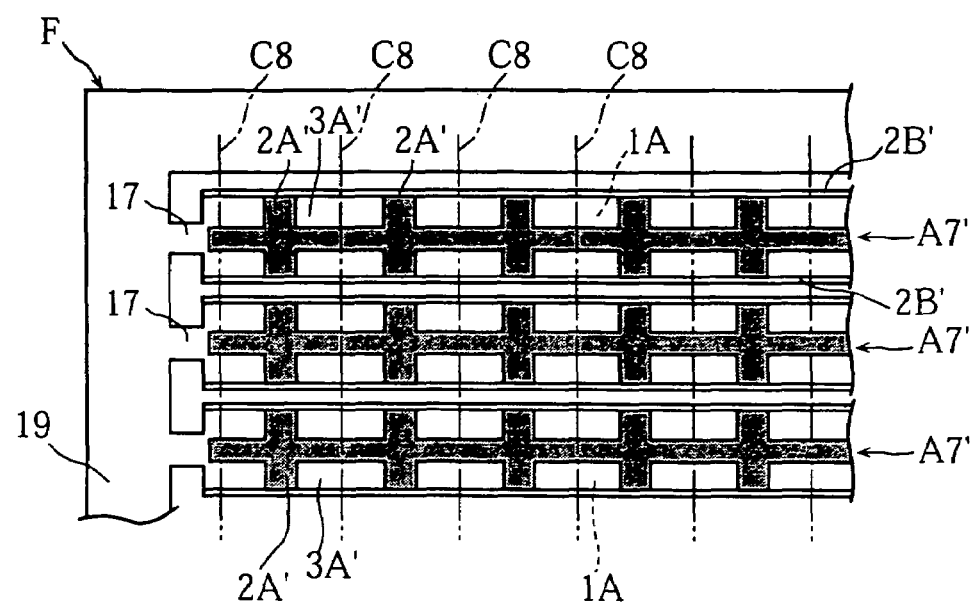
FIGS. 32A and 32B are plan views showing the main parts of an example of the processes for manufacturing the chip resistor shown in FIG. 31A.

To manufacture the chip resistor A7, first the insulation layers 2A' serving as the first insulation layer 2A and the conductive layers 3A' serving as the electrodes 3 are formed on one surface of the plate-form portions 1A of the frame F in the pattern shown in FIG. 32A, for example, thereby forming a bar-form resistor aggregate A7'. Next, the resistor aggregate A7' is cut in the locations shown by virtual lines C8 in the drawing.

Figure 32B:
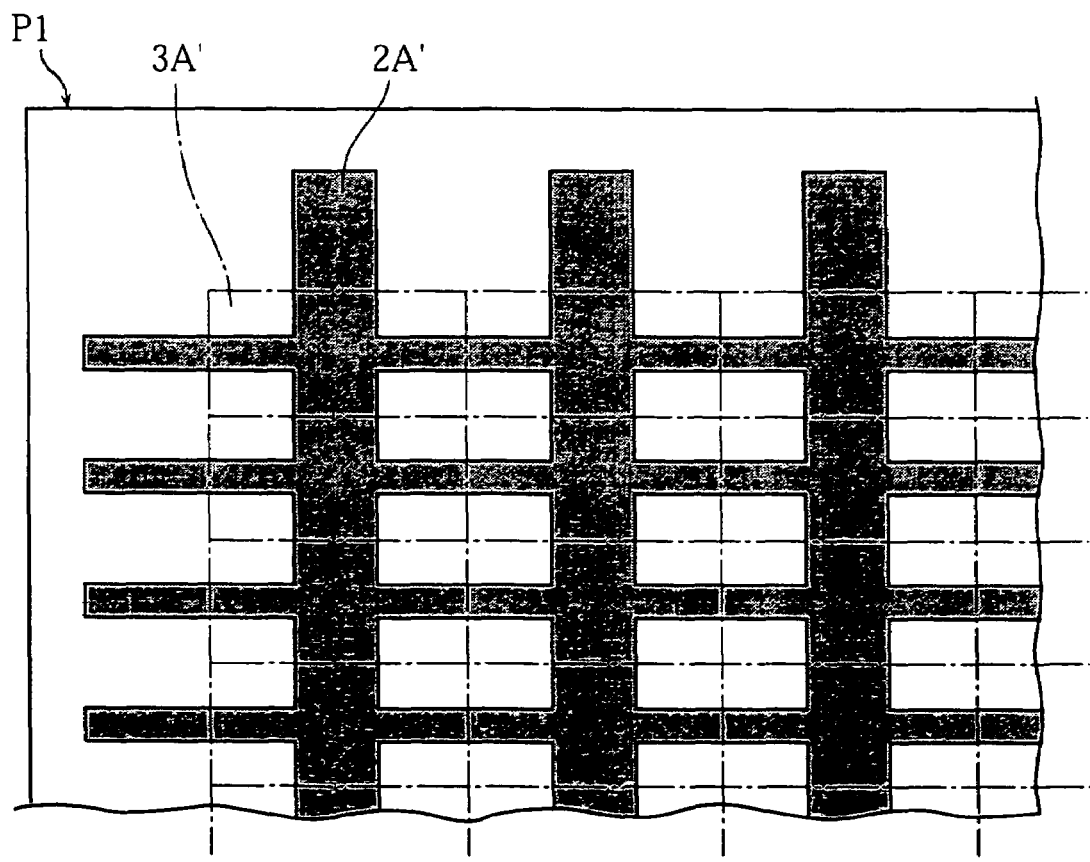

As shown in FIG. 32B, for example, the chip resistor A7 may also be manufactured by forming the insulation layers 2A' and conductive layers 3A' on the plate P1, and implementing punching on the plate P1 in the locations shown by the virtual lines in the drawing. Instead of punching, a method of cutting the locations shown by the virtual lines using a cutting device such as a shear or a rotary cutter may be employed. Note, however, that when the plate P1 is subjected only to punching or cutting, the resulting chip resistor is not formed with the second insulation layer 2B on the side faces 10c of the resistor 1. Therefore, to obtain the chip resistor A7 comprising the second insulation layer 2B, an operation to form the second insulation layer 2B is performed subsequently. Needless to say, the chip resistor A7 may be manufactured similarly to the chip resistors of the embodiments described above using the frame F shown in FIGS. 8A and 8B. This also applies to the chip resistors of the following embodiments.

As is understood from the constitution of the chip resistor A7 described above, in the present invention two pairs of (four) electrodes may be provided on the resistor, and moreover, a greater number of the electrodes 3 may be provided to form more than two pairs. The present invention may also be used in an aspect where the total number of electrodes in the chip resistor is increased and only a part of these electrodes is used, for example.

Figure 33A:
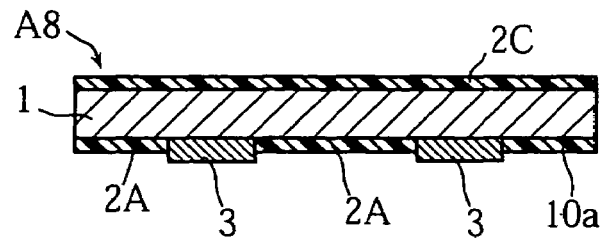
FIG. 33A is a sectional view showing another example of the chip resistor according to the present invention.
Figure 33B:
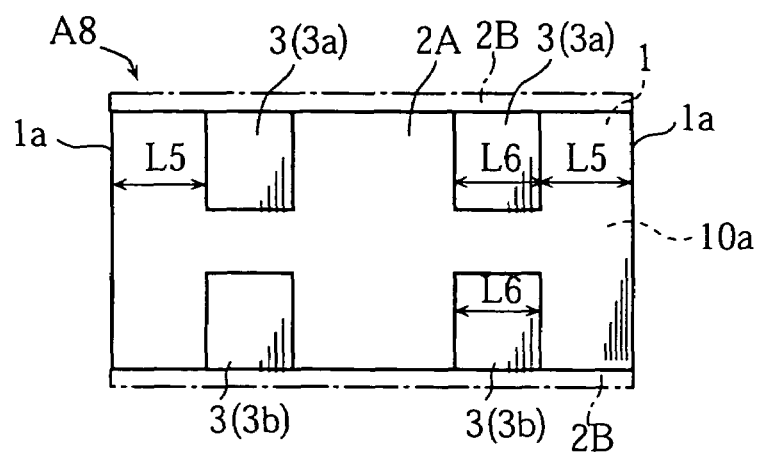
FIG. 33B is a bottom view thereof.
Figure 33C:
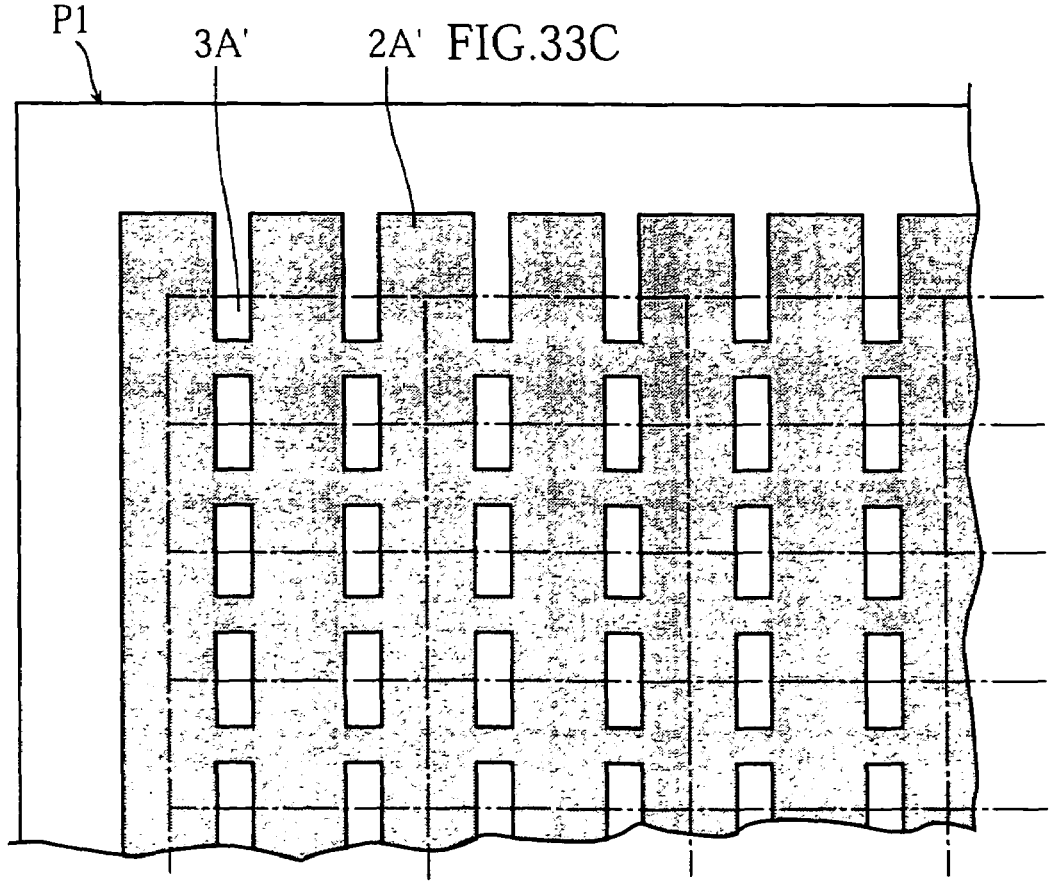
FIG. 33C is a plan view showing the main parts of an example of the processes for manufacturing the chip resistor shown in FIG. 33A.

A chip resistor A8 shown in FIGS. 33A and 33B is constituted similarly to the previous chip resistor A7 in that four of the electrodes 3 (3a, 3b) are formed on the rear surface 10a of the resistor 1. Here, the two electrodes 3a are removed from the edges 1a of the rear surface 10a by an appropriate distance L5. The two electrodes 3b are also removed from the edges 1a by an appropriate distance. To manufacture the chip resistor Aa, when the insulation layers 2A' and conductive layers 3A' are formed on one surface of the plate P1 as shown in FIG. 33C, for example, the insulation layers 2A' and conductive layers 3A' are set in the illustrated form, and the plate P1 is cut in the locations shown by the virtual lines.

Similarly to the chip resistor A7 described above, both current detection and voltage detection are possible with this chip resistor A8. In addition, the electrodes 3 are removed from the edges 1a, and therefore a width L6 thereof is reduced. As a result, large variation in the resistance value caused by offset of the mounting solder toward the inside edges or outside edges of the electrodes 3 does not occur.

Figure 34A:
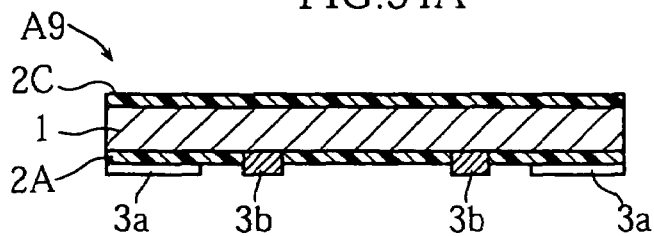
FIG. 34A is a sectional view showing another example of the chip resistor according to the present invention.
Figure 34B:
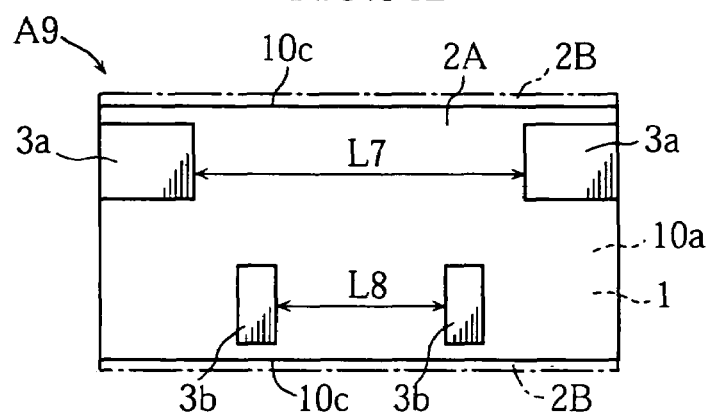
FIG. 34B is a bottom view thereof.
Figure 34C:
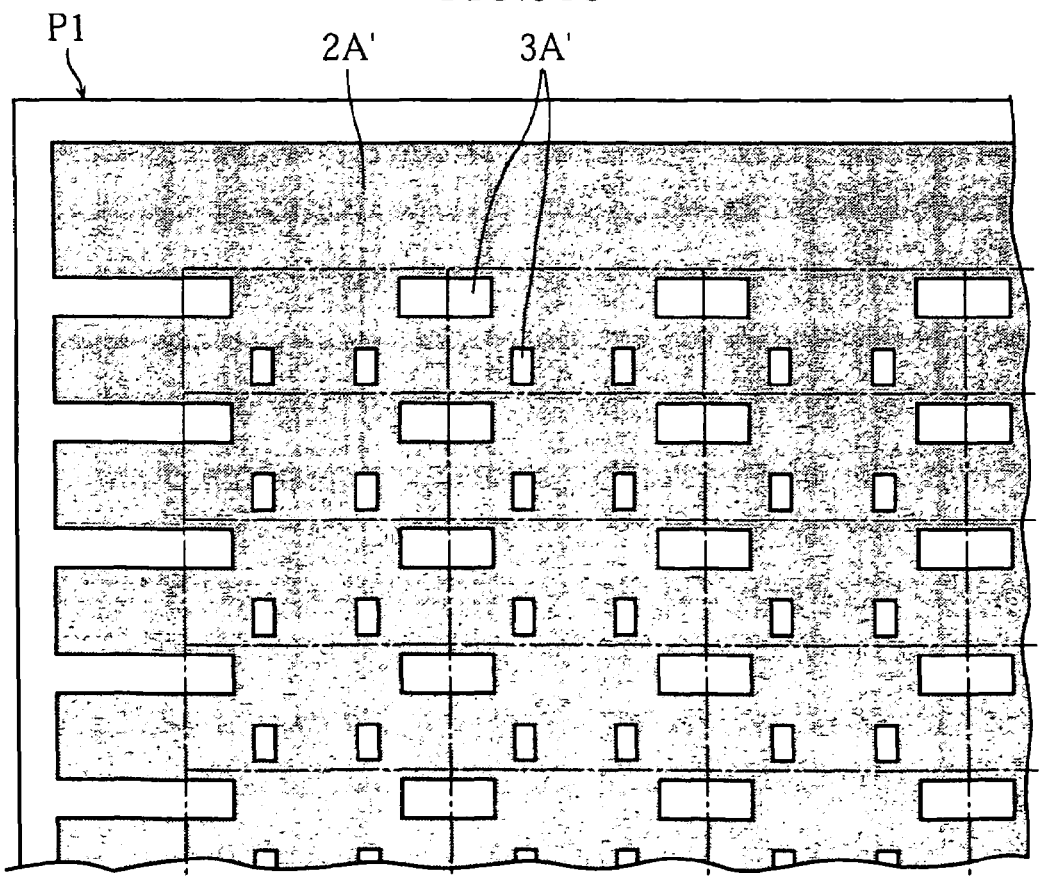
FIG. 34C is a plan view showing the main parts of an example of the processes for manufacturing the chip resistor shown in FIG. 34A.

A chip resistor A9 shown in FIGS. 34A and 34B is constituted similarly to the previous chip resistor A8 in that the two electrodes 3a and the two electrodes 3b form pairs respectively. However, the electrodes 3a and the electrodes 3b differ from each other in their form, size, and dimensions L7, L8 between the electrodes. The electrodes 3b are removed from the edges 1a of the rear surface 10a of the resistor 1, whereas the electrodes 3a are disposed in a different manner, and hence the electrodes 3b are narrower than the electrodes 3a. To manufacture the chip resistor A8, when the insulation layers 2A' and conductive layers 3A' are formed on one surface of the plate P1 as shown in FIG. 34C, for example, the insulation layers 2A' and conductive layers 3A' are set in the illustrated form, and the plate P1 is cut in the locations shown by the virtual lines.

Figure 35A:
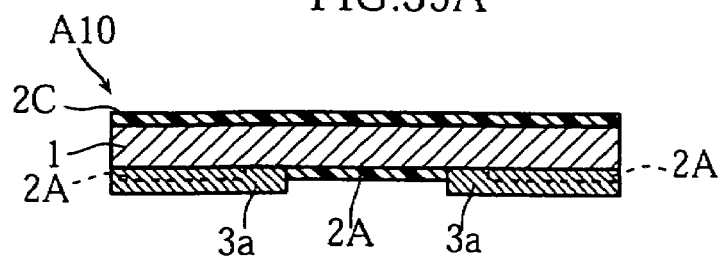
FIG. 35A is a sectional view showing another example of the chip resistor according to the present invention.
Figure 35B:
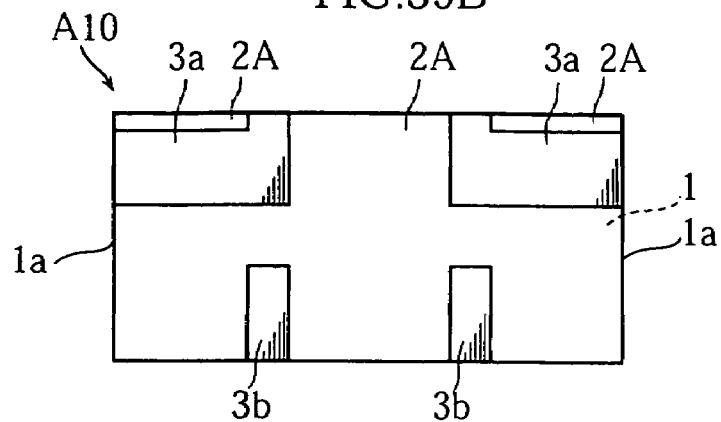
FIG. 35B is a bottom view thereof.
Figure 35C:
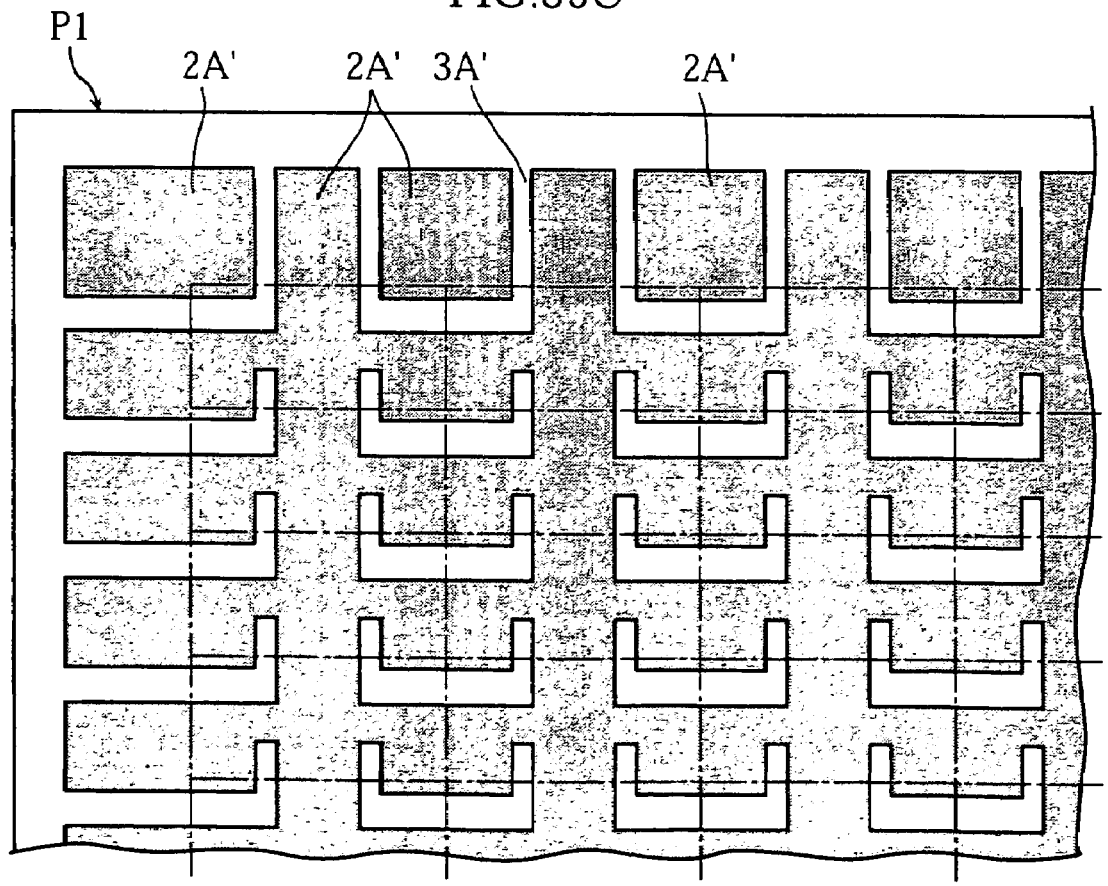
FIG. 35C is a plan view showing the main parts of an example of the processes for manufacturing the chip resistor shown in FIG. 35A.

Likewise in a chip resistor A10 shown in FIGS. 35A and 35B, similarly to the previous chip resistor A9, the two electrodes 3a and the two electrodes 3b form pairs respectively, and the electrodes 3a and the electrodes 3b differ from each other in form and size. The electrodes 3b take a narrow rectangular form, whereas the electrodes 3a take a wider, non-rectangular form. To manufacture the chip resistor A10, when the insulation layers 2A' and conductive layers 3A' are formed on one surface of the plate P1 as shown in FIG. 35C, for example, the insulation layers 2A' and conductive layers 3A' are set in the illustrated form, and the plate P1 is cut in the locations shown by the virtual lines.

In the chip resistors A9, A10, the narrow electrode pair 3b is used as voltage electrodes, and the wide electrode pair 3a is used as current electrodes. The voltage electrodes are used to measure voltage decreases accurately, and hence by using the narrow electrode pair 3b as the voltage electrodes, the amount of decrease in the voltage can be determined accurately. As is understood from these embodiments, the form, size, and so on of the plurality of electrodes in the present invention may be irregular.

The present invention is not limited to the content of the embodiments described above. The specific constitution of each portion of the chip resistor and the frame used to manufacture the chip resistor according to the present invention may be subjected to various design modifications. Likewise, the specific constitution of each step of the chip resistor manufacturing method according to the present invention may be modified in various ways.

By forming the electrodes using a plating processing method, for example, the formation operation is performed simply, and hence this method is preferable, but the present invention is not limited thereto, and another method may be used. Instead of plating processing, the solder layers may be formed by a method in which a desired part of the resistor material is brought into contact with molten solder, for example. To form the insulation layers on the resistor, a method such as resin transfer or application of a resin material may be employed instead of printing. The chip resistor according to the present invention is preferably constituted with low resistance, but there are no limitations on the specific resistance value thereof.

Figure 36A:
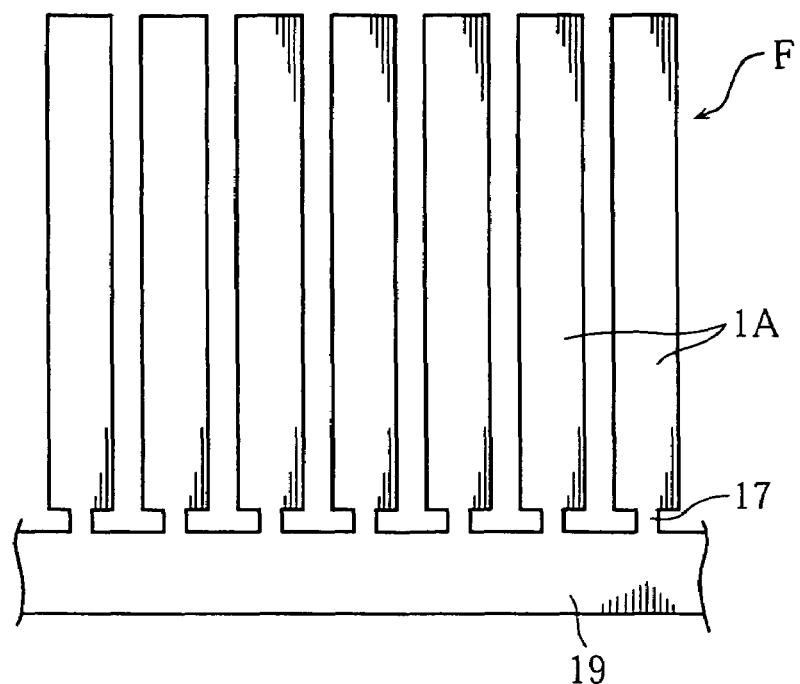
FIGS. 36A and 36B are plan view showing the main parts of another example of the frame used in the manufacture of the chip resistor.
Figure 36B:
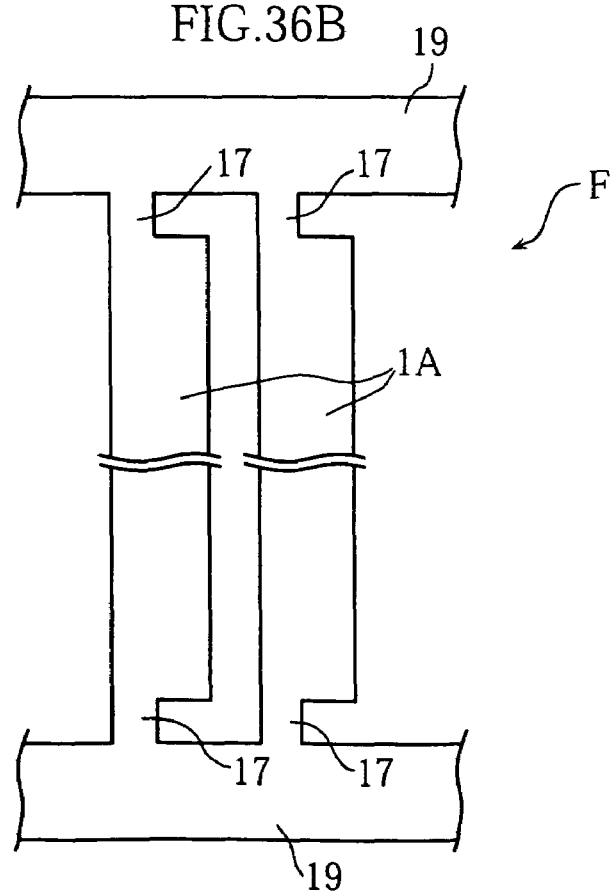

The frame used to manufacture the chip resistor may be constituted such that the plurality of plate-form portions 1A is supported on the support portion 19 in cantilever form, as shown in FIG. 36A, and hence the plate-form portions 1A do not necessarily have to be supported on the support portion 19 at both ends. Furthermore, as shown in FIG. 36B, when the connecting portions 17 between the plate-form portions 1A and support portion 19 are formed with a narrow width, the connecting portions 17 may be provided in positions offset from the center of the width direction of the plate-form portions 1A. The material of the frame, the specific size of the plate-form portions, and so on are items that may be selected appropriately in accordance with the specifications of the chip resistor that is to be manufactured ultimately.

The invention claimed is:

1. A chip resistor comprising:
 a chip resistor body made of a metal and having a front surface, a rear surface provided at an interval in a thickness direction, a pair of side surfaces extending in a length direction at an interval in a width direction, and a pair of end surfaces provided at an interval in the length direction;
 a plurality of electrodes provided in series on the rear surface of the resistor body at intervals in the length direction, the plurality of electrodes being formed by plating;
 a metal coating layer covering a respective one of the electrodes and a respective one of the end surfaces;
 a first insulation layer covering a region between the plurality of electrodes on the rear surface of the resistor body;
 a second insulation layer covering the pair of side surfaces of the resistor body; and
 a third insulation layer covering the front surface of the resistor body;

wherein each of the electrodes and the metal coating layer overlap a portion of the first insulation layer, said portion of the first insulation layer being held in direct contact with the rear surface of the resistor body and inserted between the metal coating layer and the rear surface of the resistor body, the metal coating layer extending beyond the respective electrode into direct contact with the first insulation layer, wherein the plurality of electrodes comprises two or more pairs of electrodes.

2. The chip resistor according to claim 1, wherein at least two of the first through third insulation layers are made of an identical material.

3. The chip resistor according to claim 1, wherein each of the electrodes has a greater thickness than the first insulation layer.

4. The chip resistor according to claim 1, wherein the metal coating layer comprises a solder layer.

5. The chip resistor according to claim 1, wherein each of the electrodes is spaced from a respective end surface of the resistor body in the length direction.

6. A manufacturing method for chip resistors each of which comprises:
  a chip resistor body having a front surface, a rear surface provided at an interval in a thickness direction, a pair of side surfaces extending in a length direction at an interval in a width direction, and a pair of end surfaces provided at an interval in the length direction;
  a plurality of electrodes provided in a series on the rear surface of the resistor body at intervals in the length direction;
  a metal coating layer covering a respective one of the electrodes and a respective one of the end surfaces;
  a first insulation layer covering a region between the plurality of electrodes on the rear surface of the resistor body; and
  a second insulation layer covering a pair of side surfaces of the resistor body;
  wherein each of the electrodes and the metal coating layer overlap a portion of the first insulation layer, said portion of the first insulation layer being inserted between the metal coating layer and the rear surface of the resistor body, the metal coating layer extending beyond the respective electrode into direct contact with the first insulation layer,
  the method comprising the steps of:
  producing a resistor aggregate shaped into a bar, the resistor aggregate made of a metal and having a rear face provided with a multiplicity of electrodes, the multiplicity of electrodes being formed by plating and arranged at intervals in a longitudinal direction of the resistor aggregate, regions between the multiplicity of electrodes on the rear face are covered with a first insulation layer, the resistor aggregate having a pair of side surfaces covered with a second insulation layer; and
  dividing the resistor aggregate into a plurality of chip resistors by cutting the resistor aggregate at a plurality of locations in the longitudinal direction of the resistor aggregate.

7. The manufacturing method according to claim 6, wherein the step of producing the resistor aggregate comprises the steps of:
  providing a pattern-formed insulation layer and a conductive layer serving as the electrodes on one surface of a resistor material plate;
  dividing the resistor material plate into a plurality of resistor aggregates; and
  forming an insulation layer on the pair of side surfaces of each resistor aggregate.

8. The manufacturing method according to claim 6, wherein the step of producing the resistor aggregate comprises the steps of:
  pattern-forming an insulation layer on one surface of a resistor material plate;
  dividing the resistor material plate into a plurality of resistor aggregates; and
  forming an insulation layer on the pair of side faces of each of the resistor aggregates;
  forming the multiplicity of electrodes on the rear face of the resistor aggregate.

9. The manufacturing method according to claim 6, further comprising the step of forming a third insulation layer covering a front surface of the resistor aggregate prior to dividing the resistor aggregate into the plurality of chip resistors.

10. A manufacturing method for chip resistors each of which comprises:
  a chip resistor body having a front surface, a rear surface provided at an interval in a thickness direction, a pair of side surfaces extending in a length direction at an interval in a width direction, and a pair of end surfaces provided at an interval in the length direction;
  a plurality of electrodes provided in a series in the rear surface of the resistor body at intervals in the length direction;
  a metal coating layer covering a respective one of the electrodes and a respective one of the end surfaces;
  a first insulation layer covering a region between the plurality of electrodes on the rear surface of the resistor body; and
  a second insulation layer covering the pair of side surfaces of the resistor body;
  wherein each of the electrodes and the metal coating layer overlap a portion of the first insulation layer, said portion of the first insulation layer being inserted between the metal coating layer and the rear surface of the resistor body, the metal coating layer extending beyond the respective electrode into direct contact with the first insulation layer,
  the method comprising the steps of:
  producing a resistor aggregate shaped into a bar, the resistor aggregate made of a metal and having a rear face provided with a multiplicity of electrodes, the multiplicity of electrodes being formed by plating and arranged at intervals in a longitudinal direction of the resistor aggregate between the multiplicity of electrodes on the rear face covered with a first insulation layer;
  dividing the resistor aggregate into a plurality of chip resistors by cutting the resistor aggregate at a plurality of locations in a longitudinal direction of the resistor aggregate, each of the chip resistors having side surfaces; and
  forming a second insulation layer on the side surfaces of each of the chip resistors.

11. A manufacturing method for chip resistors each of which comprises,
  a chip resistor body having a front surface, a rear surface provided at an interval in a thickness direction, a pair of side surfaces extending at a length direction at an interval in a width direction, and a pair of end surfaces provided at an interval in the length direction;
  a plurality of electrodes provided in a series on the rear surface of the resistor body at intervals in the length direction;
  a metal coating layer covering a respective one of the electrodes and a respective one of the end surfaces;

a first insulation layer covering a region between the plurality of electrodes on the rear surface of the resistor body; and a second insulation layer covering the pair of side surfaces of the resistor body;

wherein each of the electrodes and the metal coating layer overlap a portion of the first insulation layer, said portion of the first insulation layer being inserted between the metal coating layer and the rear surface of the resistor body, the metal coating layer extending beyond the respective electrode into direct contact with the first insulation layer, the method comprising the steps of:

preparing a frame of a conductive material comprising a plurality of bar portions extending in a predetermined direction, each bar portion made of a metal and having a front surface, a rear surface, and a pair of side surfaces, the frame also comprising a support portion for supporting the plurality of bar portions;

producing a plurality of resistor aggregates by forming, on the rear surface of each of the bar portions, a multiplicity of electrodes by plating, the multiplicity of electrodes being arranged at intervals in the predetermined direction and a first insulation layer positioned in regions between the plurality of electrodes, followed by forming a second insulation layer on the pair of side surfaces of each of the bar portions; and dividing each of the resistor aggregates into a plurality of chip resistors.

12. The manufacturing method according to claim 11, wherein the step of forming a second insulation layer on the pair of side surfaces of each of the bar portions is performed after rotating the bar portions about a longitudinal axis extending in a predetermined direction by twisting a connecting portion between the bar portion and the support portion of the frame.

13. The manufacturing method according to claim 12, wherein the connecting portion of the frame is narrower than each bar portion.

14. The manufacturing method according to claim 11, further comprising a step of forming the third insulation layer on the front surface of each of the bar portions before dividing each of the resistor aggregates into the plurality of chip resistors.

15. The manufacturing method according to claim 14, wherein the step of producing the resistor aggregates comprises forming the multiplicity of electrodes by plating after forming the first through third insulation layers on each of the bar portions.

16. A chip resistor comprising:

a chip resistor body made of a metal and having a front surface, a rear surface provided at an interval in a thickness direction, a pair of side surfaces extending in a length direction at an interval in a width direction, and a pair of end surfaces provided at an interval in the length direction;

a plurality of electrodes provided in a series on the rear surface of the resistor body at intervals in the length direction, the plurality of electrodes being formed by plating;

a metal coating layer covering a respective one of the electrodes and a respective one of the end surfaces;

a first insulation layer covering a region between the plurality of electrodes on the rear surface of the resistor body; and a second insulation layer covering the pair of side surfaces of the resistor body;

wherein each of the electrodes and the metal coating layer overlap a portion of the first insulation layer, said portion of the first insulation layer being held in direct contact with the rear surface of the resistor body and inserted between the metal coating layer and the rear surface of the resistor body, the metal coating layer extending beyond the respective electrode into direct contact with the first insulation layer, wherein each of the plurality of electrodes is held in direct contact with the rear surface of the resistor body.

* * * * *